(12) United States Patent
Pei et al.

(10) Patent No.: US 10,504,815 B2
(45) Date of Patent: Dec. 10, 2019

(54) INTEGRATED FAN-OUT PACKAGES WITH EMBEDDED HEAT DISSIPATION STRUCTURE

(71) Applicant: Taiwan Semiconductor Manufacturing Company, Ltd., Hsinchu (TW)

(72) Inventors: Hao-Jan Pei, Hsinchu (TW); Wei-Yu Chen, Taipei (TW); Chia-Shen Cheng, Hsinchu (TW); Chih-Chiang Tsao, Taoyuan (TW); Cheng-Ting Chen, Taichung (TW); Chia-Lun Chang, Tainan (TW); Chih-Wei Lin, Zhubei (TW); Hsiu-Jen Lin, Zhubei (TW); Ching-Hua Hsieh, Hsinchu (TW); Chung-Shi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/940,623

(22) Filed: Mar. 29, 2018

(65) Prior Publication Data

US 2019/0148262 A1    May 16, 2019

Related U.S. Application Data

(60) Provisional application No. 62/586,587, filed on Nov. 15, 2017.

(51) Int. Cl.
*H01L 23/373* (2006.01)
*H01L 23/50* (2006.01)
(Continued)

(52) U.S. Cl.
CPC ........ *H01L 23/3736* (2013.01); *H01L 21/486* (2013.01); *H01L 21/56* (2013.01);
(Continued)

(58) Field of Classification Search
CPC ....... H01L 25/065; H01L 21/78; H01L 25/00; H01L 21/56; H01L 23/552;
(Continued)

(56) References Cited

U.S. PATENT DOCUMENTS 8,462,511 B2 * 6/2013 Lee .......................... H05K 7/20
257/686
9,000,584 B2    4/2015 Lin et al.
(Continued)

*Primary Examiner* — Alexander O Williams
(74) *Attorney, Agent, or Firm* — Slater Matsil, LLP

(57) ABSTRACT

A semiconductor structure includes a die embedded in a molding material, the die having die connectors on a first side; a first redistribution structure at the first side of the die, the first redistribution structure being electrically coupled to the die through the die connectors; a second redistribution structure at a second side of the die opposing the first side; and a thermally conductive material in the second redistribution structure, the die being interposed between the thermally conductive material and the first redistribution structure, the thermally conductive material extending through the second redistribution structure, and the thermally conductive material being electrically isolated.

20 Claims, 26 Drawing Sheets

(51) Int. Cl.
*H01L 23/00* (2006.01)
*H01L 21/56* (2006.01)
*H01L 21/48* (2006.01)
*H01L 23/31* (2006.01)
*H01L 23/367* (2006.01)
*H01L 23/538* (2006.01)
*H01L 25/10* (2006.01)
*H01L 23/498* (2006.01)

(52) U.S. Cl.
CPC ...... *H01L 23/3121* (2013.01); *H01L 23/3677* (2013.01); *H01L 23/50* (2013.01); *H01L 23/5389* (2013.01); *H01L 24/83* (2013.01); *H01L 25/105* (2013.01); *H01L 23/49816* (2013.01); *H01L 2224/18* (2013.01); *H01L 2224/48091* (2013.01); *H01L 2224/48227* (2013.01); *H01L 2924/15311* (2013.01)

(58) Field of Classification Search
CPC . H01L 23/0657; H01L 23/3736; H01L 23/50; H01L 24/83; H01L 21/486; H01L 23/3121; H01L 23/3677; H01L 23/5389; H01L 25/105; H01L 2224/18; H01L 2224/48091; H01L 2224/48227; H01L 2924/15311; H01L 34/49816; H01L 224/48091; H01L 2924/00014
USPC .................. 257/686, 685, 723, 777, 778
See application file for complete search history.

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,412,714 B2 * | 8/2016 | Co | H01L 24/17 |
| 9,496,189 B2 | 11/2016 | Yu et al. | |
| 9,543,373 B2 * | 1/2017 | Liang | H01L 28/10 |
| 9,613,931 B2 * | 4/2017 | Lin | H01L 25/0652 |
| 9,620,482 B1 * | 4/2017 | Chen | H01L 25/0657 |
| 9,786,623 B2 * | 10/2017 | Lin | H01L 21/561 |
| 10,014,292 B2 * | 7/2018 | Or-Bach | H01L 27/0688 |
| 10,079,192 B2 * | 9/2018 | Hsiao | H01L 23/49894 |
| 10,163,800 B2 * | 12/2018 | Chen | H01L 23/5384 |
| 10,163,802 B2 * | 12/2018 | Lin | H01L 24/20 |
| 10,170,341 B1 * | 1/2019 | Lin | H01L 21/566 |
| 10,204,883 B2 * | 2/2019 | Chen | H01L 21/78 |

* cited by examiner

INTEGRATED FAN-OUT PACKAGES WITH EMBEDDED HEAT DISSIPATION STRUCTURE

PRIORITY CLAIM AND CROSS-REFERENCE

This application claims priority to U.S. Provisional Patent Application No. 62/586,587 filed Nov. 15, 2017, entitled "Integrated Fan-Out Packages and Methods of Forming the Same," which application is hereby incorporated by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

An example of these packaging technologies is the Package-on-Package (POP) technology. In a PoP package, a top semiconductor packages is stacked on top of a bottom semiconductor package to allow high level of integration and component density. Another example is the Multi-Chip-Module (MCM) technology, where multiple semiconductor dies are packaged in one semiconductor package to provide semiconductor devices with integrated functionalities.

The high level of integration of advanced packaging technologies enables production of semiconductor devices with enhanced functionalities and small footprints, which is advantageous for small form factor devices such as mobile phones, tablets and digital music players. Another advantage is the shortened length of the conductive paths connecting the interoperating parts within the semiconductor package. This improves the electrical performance of the semiconductor device, since shorter routing of interconnections between circuits yields faster signal propagation and reduced noise and cross-talk.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of semiconductor packages and methods of forming the semiconductor packages, and in particular, integrated fan-out (InFO) semiconductor packages. In some embodiments, the semiconductor package has a die embedded in a molding material, and redistribution structures (e.g., a backside redistribution structure and a front side redistribution structure) on opposing sides of the die. In some embodiments, portions of the dielectric layers of the backside redistribution structure are removed to form one or more opening in the backside redistribution structure. The one or more openings are directly over the backside of the die, in some embodiments. Metal paste, such as copper paste, silver paste, or solder paste, are formed in the one or more openings, and are cured in a subsequent reflow process, in the illustrated embodiments. Due to the high thermal conductivity of the metal paste, heat dissipation of the semiconductor package is improved.

Figure 1:
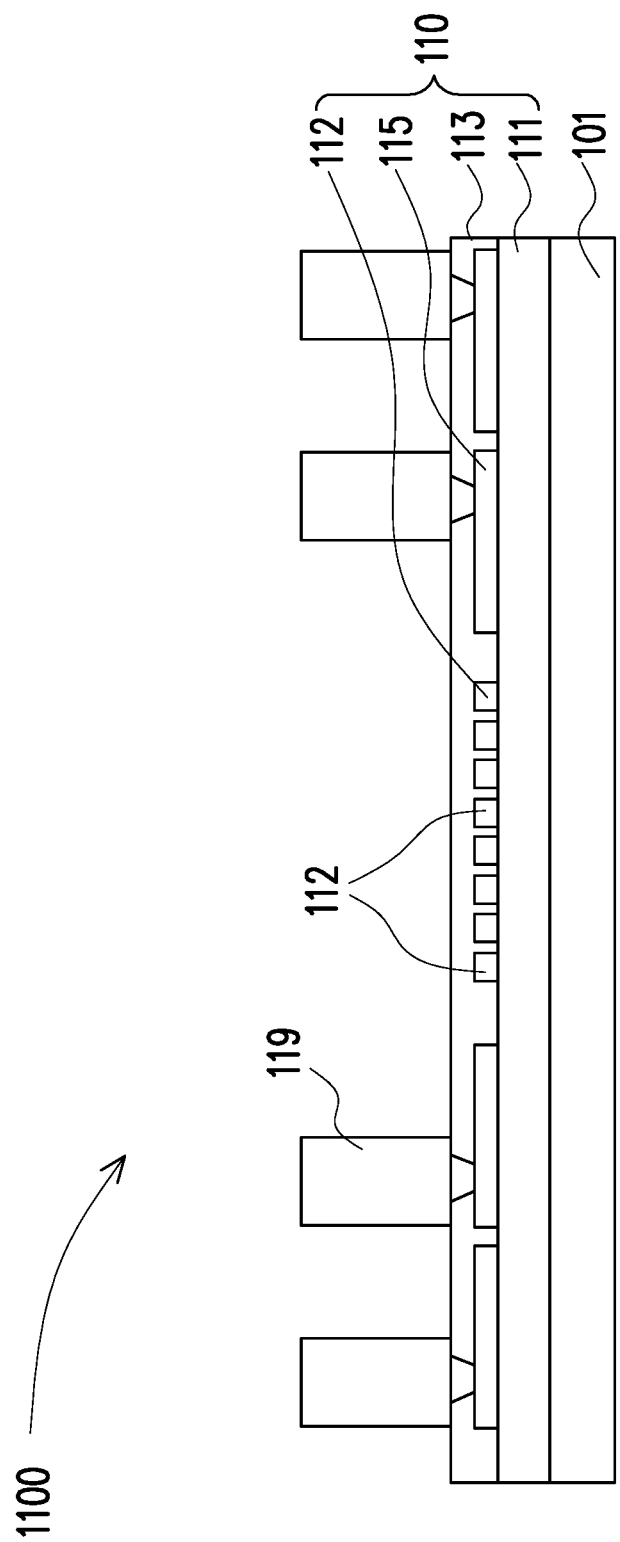
FIGS. 1-8 illustrate cross-sectional views of a semiconductor package at various stages of fabrication, in accordance with an embodiment.

FIGS. 1-8 illustrate cross-sectional views of a semiconductor package 1100 at various stages of fabrication, in accordance with an embodiment. In FIG. 1, a redistribution structure 110 is formed over a carrier 101. The redistribution structure 110 comprises conductive features (e.g., conductive lines 115) formed in one or more dielectric layers (e.g., 111 and 113). FIG. 1 also illustrates dummy metal patterns 112 of the redistribution structure 110, which dummy metal patterns 112 are electrically isolated. Conductive pillars 119 are formed over the redistribution structure 110 and are electrically coupled to the redistribution structure 110.

The carrier 101 may be made of a material such as silicon, polymer, polymer composite, metal foil, ceramic, glass, glass epoxy, beryllium oxide, tape, or other suitable material for structural support. The redistribution structure 110 is formed over the carrier 101. The redistribution structure 110 comprises conductive features, such as one or more layers of conductive lines (e.g., 115) and vias (not shown), and one or more dielectric layers (e.g., 111, 113). Although two dielectric layers are illustrated in FIG. 1, more or less than two dielectric layers may be formed in the redistribution structure 110. Similar, one or more layers of the conductive lines and one or more layers of conductive vias may be formed in the redistribution structure 110.

In some embodiments, an adhesive layer (not shown) is deposited or laminated over the carrier 101 before the redistribution structure 110 is formed. The adhesive layer may be photosensitive and may be easily detached from the carrier 101 by, e.g., shining an ultra-violet (UV) light on the carrier 101 in a subsequent carrier de-bonding process. For example, the adhesive layer may be a light-to-heat-conversion (LTHC) coating made by 3M Company of St. Paul, Minn.

Next, the dielectric layer 111 is formed over the carrier 101, or over the adhesive layer (e.g., an LTHC coating) if formed. In some embodiments, the dielectric layer 111 is formed of a polymer, such as polybenzoxazole (PBO), polyimide, benzocyclobutene (BCB), or the like; a nitride such as silicon nitride; an oxide such as silicon oxide, phosphosilicate glass (PSG), borosilicate glass (BSG), boron-doped phosphosilicate glass (BPSG), or the like. The dielectric layer 111 may be formed by a suitable deposition process, such as spin coating, chemical vapor deposition (CVD), laminating, the like, or a combination thereof.

Next, the conductive features (e.g., 115, 112) of the redistribution structure 110 are formed over the dielectric layer 111. In some embodiments, the conductive features of the redistribution structure 110 comprise conductive lines (e.g., 115) and dummy metal patterns (e.g., 112) formed of a suitable conductive material such as copper, titanium, tungsten, aluminum, or the like. In some embodiments, the conductive features (e.g., the conductive lines 115 and dummy metal patterns 112) are formed by forming a seed layer (not shown) over the dielectric layer 111, forming a patterned photoresist with a designed pattern (e.g., openings) over the seed layer, plating (e.g., electroplating or electroless plating) the conductive material in the designed pattern and over the seed layer, and removing the photoresist and portions of seed layer on which the conductive material is not formed. Other methods of forming the redistribution structure 110 are also possible and are fully intended to be included within the scope of the present disclosure.

As illustrated in the example of FIG. 1, the dummy metal patterns 112 are formed in the same processing step using the same material as forming the conductive lines 115. The dummy metal patterns 112 are electrically isolated (e.g., not connected to a functional electrical circuit). The dummy metal patterns 112 are formed in a region where the die 120 (see FIG. 2) will be attached to the redistribution structure 110. As will be discussed in more details hereinafter, the dummy metal pattern 112 may advantageously improve heat dissipation of the semiconductor package 1100 formed. In some embodiments, the dummy metal pattern 112 is omitted.

Next, the dielectric layer 113 is formed over the conductive features (e.g., 115 and 112) and over the dielectric layer 111. The material of the dielectric layer 113 and the formation method of the dielectric layer 113 may be the same or similar to those of the dielectric layer 111, thus details are not repeated. In the discussion hereinafter, the redistribution structure 110 may also be referred to as a backside redistribution structure.

Still referring to FIG. 1, conductive pillars 119 are formed over the redistribution structure 110. The conductive pillars 119 may be formed by: forming openings in an uppermost dielectric layer (e.g., 113) of the redistribution structure 110 to expose underlying conductive features (e.g., copper pads or copper lines), forming a seed layer over the uppermost dielectric layer of the redistribution structure 110 and in the openings; forming a patterned photoresist over the seed layer, where each of the openings in the patterned photoresist corresponds to a location of the conductive pillar 119 to be formed; filling the openings with an electrically conductive material such as copper using, e.g., electroplating or electroless plating; removing the photoresist using, e.g., an ashing or a stripping process; and removing portions of the seed layer on which the conductive pillars 119 are not formed. Other methods for forming the conductive pillars 119 are also possible and are fully intended to be included within the scope of the present disclosure.

Various embodiments of the present disclosure illustrate semiconductor packages (e.g., 1100, 1200, 1300, 1400, 1400A-1400H, 1100A-1100D) having the backside redistribution structure 110. The principle of the present disclosure, however, is applicable to semiconductor packages without a backside redistribution structure. Therefore, the backside redistribution structure 110 of each of the disclosed embodiments (e.g., 1100, 1200, 1300, 1400, 1400A-1400H, 1100A-1100D) may be omitted. In embodiments where the backside redistribution structure 110 is not formed, the conductive pillars 119 may be formed over the carrier 101 by the following processing: forming an adhesive layer (e.g., LTHC coating) over the carrier 101; forming a dielectric layer (e.g., 111) over the adhesive layer (e.g., LTHC coating); forming a seed layer over the dielectric layer (e.g., 111); forming a patterned photoresist over the seed layer, where each of the openings in the patterned photoresist corresponds to a location of the conductive pillar 119 to be formed; filling the openings with the electrically conductive material such as copper using, e.g., electroplating or electroless plating; removing the photoresist using, e.g., an ashing or a stripping process; and removing portions of the seed layer on which the conductive pillars 119 are not formed. For embodiments without the backside redistribution structure 110, subsequent processing steps may be similar to those described hereinafter for embodiments having the backside redistribution structure. One skilled in the art, upon reading the present disclosure, would be able to modify the descriptions hereinafter for use in embodiments without the backside redistribution structure 110. These and other modifications are fully intended to be included within the scope of the present disclosure.

Figure 2:
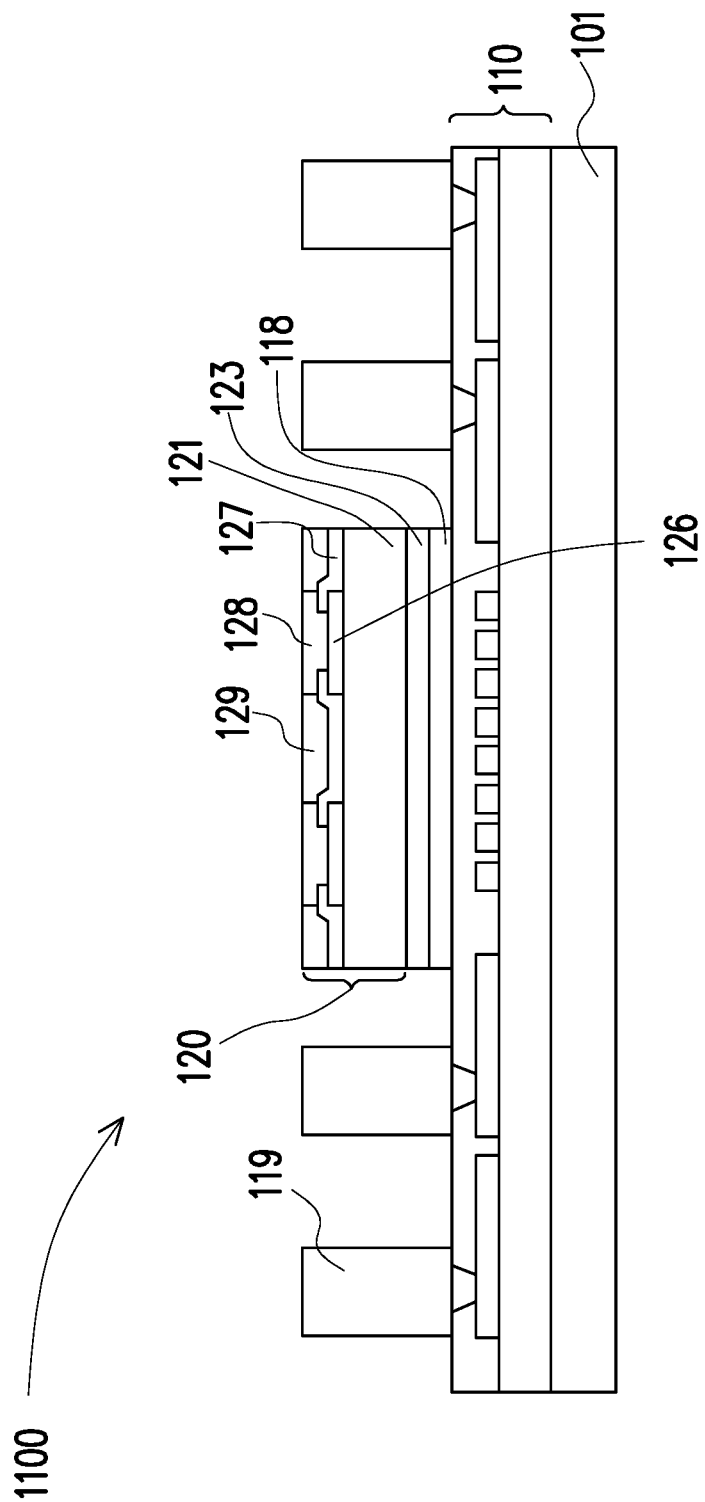

Next, in FIG. 2, a semiconductor die 120 (may also be referred to a die, or an integrated circuit (IC) die) with a dummy metal layer 123 on its backside is attached to the upper surface of the redistribution structure 110. An adhesive film 118, such as a die attaching film (DAF), may be used to attach the die 120 to the redistribution structure 110.

Before being adhered to the redistribution structure 110, the die 120 may be processed according to applicable manufacturing processes to form integrated circuits in the die 120. For example, the die 120 may include a semiconductor substrate and one or more overlying metallization layers, collectively illustrated as element 121. The semiconductor substrate may be, e.g., silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices (not shown), such as transistors, diodes, capacitors, resistors, etc., may be formed in and/or on the semiconductor substrate and may be interconnected by the metallization layers, e.g., metallization patterns in one or more dielectric layers on the semiconductor substrate, to form an integrated circuit.

The die 120 further comprise pads 126, such as aluminum pads, to which external connections are made. The pads 126 are on what may be referred to as active side or front side of the die 120. The die 120 further comprises passivation film 127 at the front side of the die 120 and on portions of the pads 126. Openings extend through the passivation film 127 to the pads 126. Die connectors 128, such as conductive pillars (for example, comprising a metal such as copper), extend into the openings of the passivation film 127 and are mechanically and electrically coupled to the respective pads 126. The die connectors 128 may be formed by, for example, plating, or the like. The die connectors 128 are electrically coupled to the integrated circuits of the die 120.

A dielectric material 129 is formed on the active sides of the die 120, such as on the passivation film 127 and/or the die connectors 128. The dielectric material 129 laterally encapsulates the die connectors 128, and the dielectric material 129 is laterally coterminous with the die 120. The dielectric material 129 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; or a combination thereof, and may be formed, for example, by spin coating, lamination, CVD, or the like.

FIG. 2 further illustrates the dummy metal layer 123 formed on the backside of the die 120. For example, the dummy metal layer 123 may have a same size (e.g., length, width, and area) as the backside of the die 120. The dummy metal layer 123 may comprise a suitable metal for heat dissipation, e.g., copper, and may be formed over the backside of the die 120 by plating, sputtering, coating, laminating, or other suitable method. A thickness of the dummy metal layer 123 may be in a range from a few micrometers (e.g., about 2 µm) to tens of micrometers (e.g., less than 100 µm), although other dimensions are also possible. The dummy metal layer 123 is electrically isolated, and therefore, is not connected to any functional circuits, in the illustrated embodiment.

Figure 3:
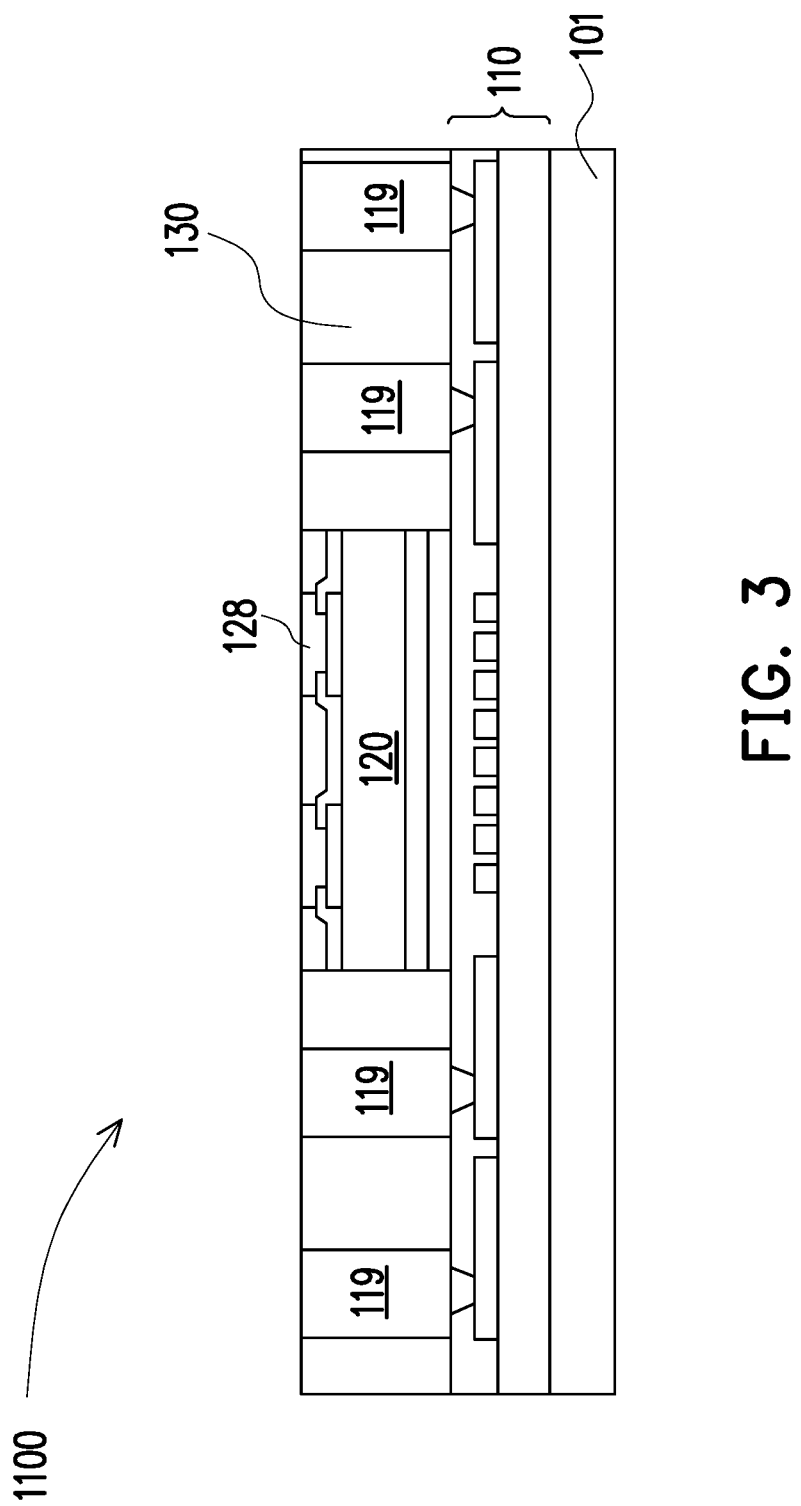

Next, in FIG. 3, a molding material 130 is formed over the redistribution structure 110, around the die 120 and around the conductive pillars 119. The molding material 130 may comprise an epoxy, an organic polymer, a polymer with or without a silica-based or glass filler added, or other materials, as examples. In some embodiments, the molding material 130 comprises a liquid molding compound (LMC) that is a gel type liquid when applied. The molding material 130 may also comprise a liquid or solid when applied. Alternatively, the molding material 130 may comprise other insulating and/or encapsulating materials. The molding material 130 is applied using a wafer level molding process in some embodiments. The molding material 130 may be molded using, for example, compressive molding, transfer molding, or other methods.

Next, the molding material 130 is cured using a curing process, in some embodiments. The curing process may comprise heating the molding material 130 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 130 may be cured using other methods. In some embodiments, a curing process is not included.

Next, a planarization process, such as chemical and mechanical polish (CMP), may be performed to remove excess portions of the molding material 130 over the front side of the die 120. After the planarization process, the molding material 130, the conductive pillar 119, and the die connectors 128 have a coplanar upper surface, in some embodiments.

Figure 4:
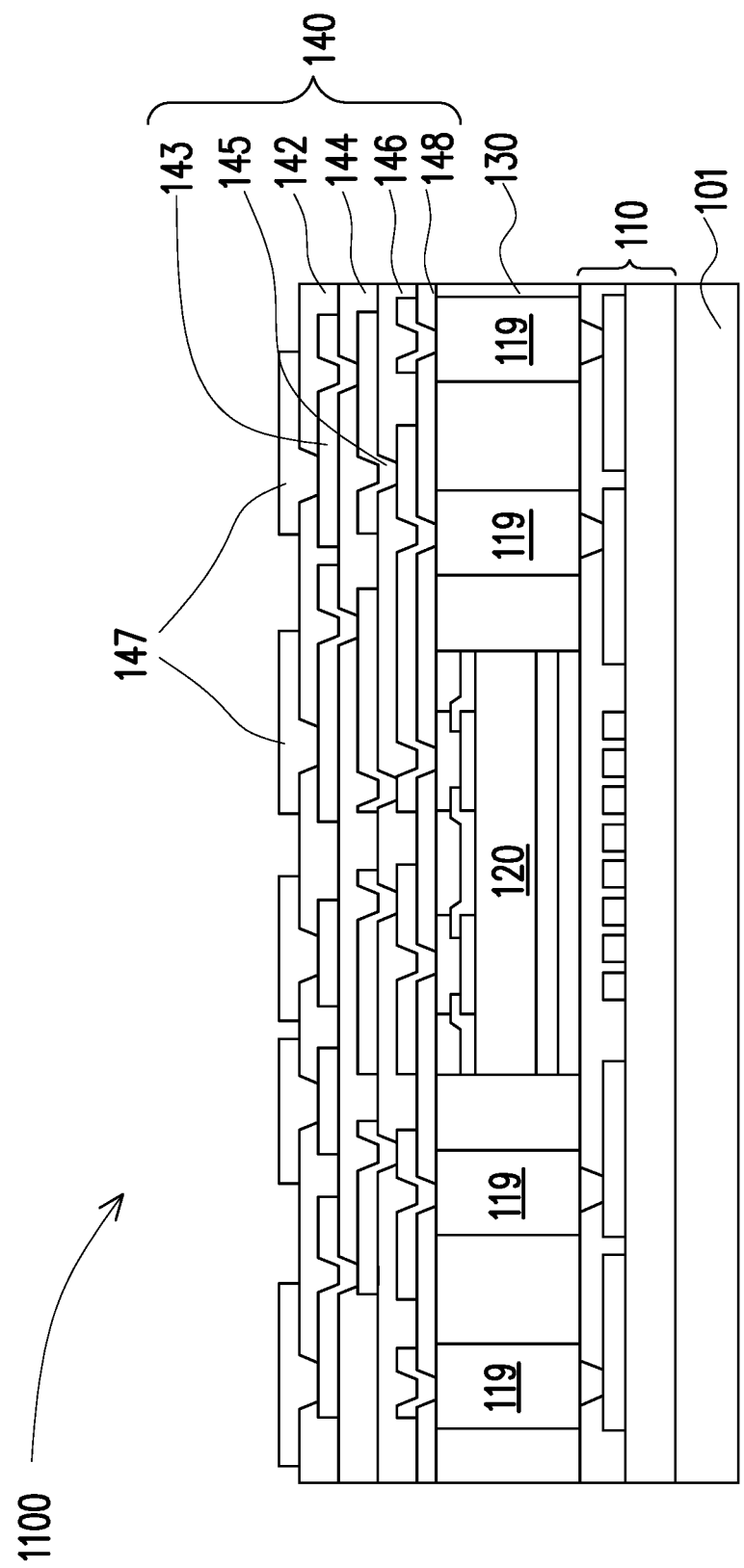

Referring next to FIG. 4, a redistribution structure 140 (may also be referred to as a front side redistribution structure) is formed over the molding material 130, the conductive pillar 119, and the die 120. The redistribution structure 140 comprises one or more layers of electrically conductive features (e.g., conductive lines 143, vias 145) formed in one or more dielectric layer (e.g., 142, 144, 146, and 148).

In some embodiments, the one or more dielectric layers (e.g., 142, 144, 146, and 148) are formed of a polymer, such as PBO, polyimide, BCB, or the like; a nitride such as silicon nitride; an oxide such as silicon oxide, PSG, BSG, BPSG, or the like. The one or more dielectric layers may be formed by a suitable deposition process, such as spin coating, CVD, laminating, the like, or a combination thereof.

In some embodiments, the conductive features of the redistribution structure 140 comprise conductive lines (e.g., 143) and conductive vias (e.g., 145) formed of a suitable conductive material such as copper, titanium, tungsten, aluminum, or the like. The redistribution structure 140 may be formed by: forming a dielectric layer, forming openings in the dielectric layer to expose underlying conductive features, forming a seed layer (not shown) over the dielectric layer and in the openings, forming a patterned photoresist (not shown) with a designed pattern over the seed layer, plating (e.g., electroplating or electroless plating) the conductive material in the designed pattern and over the seed layer, and removing the photoresist and portions of seed layer on which the conductive material is not formed. Other methods of forming the redistribution structure 140 are also possible and are fully intended to be included within the scope of the present disclosure.

The number of dielectric layers and the number of layers of the conductive features in the redistribution structures 140 of FIG. 4 are merely non-limiting examples. Other numbers of the dielectric layers and other numbers of layers of the conductive features are also possible and are fully intended to be included within the scope of the present disclosure.

FIG. 4 also illustrates under bump metallization (UBM) structures 147 formed over and electrically coupled to the redistribution structure 140. To form the UBM structures 147, openings are formed in the topmost dielectric layer (e.g., 142) of the redistribution structure 140 to expose conductive features (e.g., copper lines or copper pads) of the redistribution structure 140. After the openings are formed, the UBM structures 147 may be formed in electrical contact with the exposed conductive features. In an embodiment, the UBM structures 147 comprise three layers of conductive materials, such as a layer of titanium, a layer of copper, and a layer of nickel. However, there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM structures 147. Any suitable materials or layers of material that may be used for the UBM structures 147 are fully intended to be included within the scope of the present disclosure.

The UBM structures 147 may be formed by forming a seed layer over the topmost dielectric layer (e.g., 142) and along the interior of the openings in the topmost dielectric layer; forming a patterned mask layer (e.g., photoresist) over the seed layer; forming (e.g., by plating) the conductive material(s) in the openings of the patterned mask layer and over the seed layer; removing the mask layer and remove portions of the seed layer on which the conductive material (s) is not formed. Other methods for forming the UBM structures 147 are possible and are fully intended to be included within the scope of the present disclosure. Upper surfaces of the UBM structures 147 in FIG. 4 are illustrated to be planar merely as an example, the upper surfaces of the UBM structures 147 may not be planar. For example, portions (e.g., peripheral portions) of each UBM structure 147 may be formed over the topmost dielectric layer (e.g., 142), and other portions (e.g., center portions) of each UBM structure 147 may be formed conformally along sidewalls of the topmost dielectric layer exposed by a corresponding opening, as skilled artisans ready appreciate.

Figure 5:
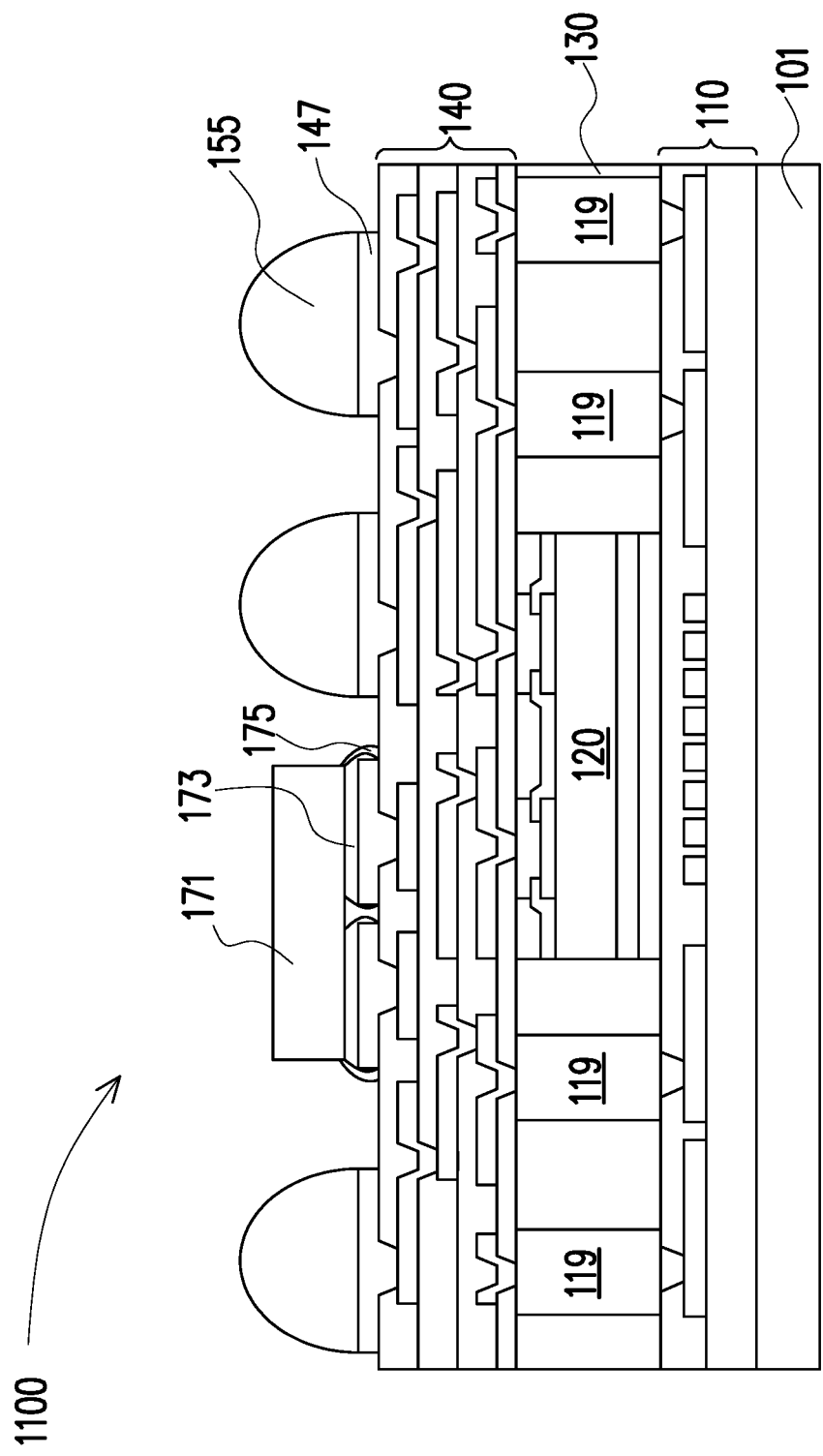

Next, in FIG. 5, connectors 155 are formed over the UBM structures 147 in accordance with some embodiments. The connectors 155 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 155 may include a conductive material such as solder, copper, aluminum, gold, nickel, silver, palladium, tin, the like, or a combination thereof. In some embodiments, the connectors 155 comprise a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. The connectors 155 may form a grid, such as a ball grid array (BGA). In some embodiments, a reflow process may be performed, giving the connectors 155 a shape of a partial sphere in some embodiments. Alternatively, the connectors 155 may comprise other shapes. The connectors 155 may also comprise non-spherical conductive connectors, for example.

In some embodiments, the connectors 155 comprise metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls.

FIG. 5 further illustrates an electrical device 171, such as an integrated passive device (IPD), that is electrically coupled to the redistribution structure 140 through, e.g., the UBM structures 147. Conductive joints 173 may be formed between the electrical device 171 and redistribution structure 140. The conductive joints 173 may be formed of a same material (e.g., solder) as the connectors 155. In addition, an underfill material 175 may be formed in a gap between the electrical device 171 and the redistribution structure 140.

Figure 6:
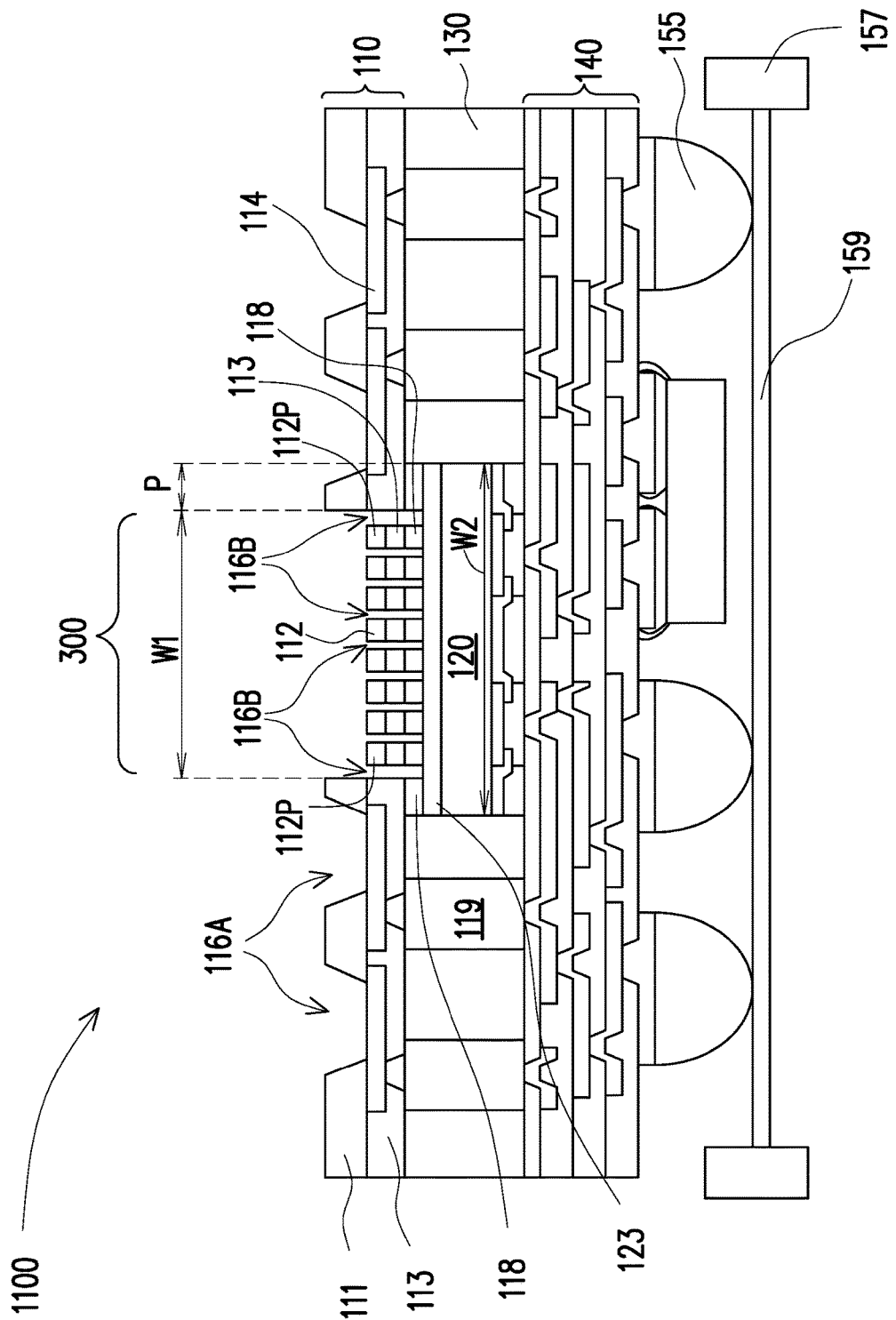

Next, in FIG. 6, the semiconductor package 1100 is flipped over, and the connectors 155 are attached to a tape 159 (e.g., a dicing tape) supported by a frame 157. Next, the carrier 101 is de-bonded from the redistribution structure 110 by a suitable process, such as etching, grinding, or mechanical peel off. In an embodiment where an adhesive layer (e.g., an LTHC film) is formed between the carrier 101 and the redistribution structure 110, the carrier 101 is de-bonded by exposing the carrier 101 to a laser or UV light. The laser or UV light breaks the chemical bonds of the adhesive layer that binds to the carrier 101, and the carrier 101 can then be easily detached.

After de-bonding the carrier 101, openings 116A are formed in the dielectric layer 111 of the redistribution structure 110 to expose conductive features 114 (e.g., conductive pads) of the redistribution structure 110. In addition, openings 116B are formed in a region 300 directly over the die 120 to expose portions of the dummy metal layer 123 on the backside of the die 120. As illustrated in FIG. 6, the openings 116B are formed in the region 300 of the redistribution structure 110 containing the dummy metal patterns 112. In some embodiments, the openings 116B are formed between neighboring dummy metal patterns 112. The openings 116B may also be formed between a peripheral dummy metal pattern 112P (e.g., a dummy metal pattern furthest from a center of the dummy metal patterns) and a functional conductive feature of the redistribution structure 110, wherein the functional conductive feature refers to a conductive line or a conductive via that has electrical current flow through it during normal operation of the semiconductor package. In other words, the functional conductive feature is a non-dummy conductive feature.

To form the openings 116 (e.g., 116A, 116B), a laser drilling process, an etching process, the like, or combinations thereof, may be used. In some embodiments, a suitable etching process, such as a plasma etch process, is used to form the openings 116. In some embodiments, the etching process (e.g., plasma etch process) used to form the openings 116 is selective (e.g., having a higher etching rate) to the dielectric material(s) of the redistribution structure 110. In an exemplary embodiment, a patterned mask layer (now shown) is formed over the redistribution structure 110, where patterns (e.g., openings) of the patterned mask layer correspond to locations of the openings 116. The selective etching process (e.g., plasma etch process) may then be performed to remove the dielectric material(s) of the redistribution structure 110 exposed by the patterns of the patterned mask layer without substantially removing the conductive features (e.g., 114, 112, and 123). In some embodiments, the conductive features (e.g., 114, 112, and 123) act as etch stop layers for the selective etching process. Therefore, the openings 116A and 116B are formed in a same etching process using a single mask layer, in some embodiments, although the openings 116A and 116B may be formed in different processing steps (e.g., different etching processes) and/or using multiple mask layers.

As illustrated in FIG. 6, after the openings 116A are formed, portions of the dielectric layer 111 laterally offset from the dummy metal patterns 112 (e.g., outside the region 300) remain. In contrast, the dielectric layer 111 directly over the dummy metal patterns 112 (e.g., in the region 300) are removed during formation of the openings 116B, and therefore, upper surfaces and sidewalls of the dummy metal patterns 112 are exposed by the openings 116B.

As illustrated in FIG. 6, the openings 116B extend through the redistribution structure 110 and through the adhesive film 118. In the illustrated embodiment, the openings 116B stop at the surface of the dummy metal layer 123 distal the die 120, and therefore, the openings 116B do not extend through the dummy metal layer 123. Since the openings 116B extend through the adhesive film 118, the adhesive film 118 may be referred to as a perforated adhesive film after the openings 116B are formed.

In the example of FIG. 6, a width $W_1$ of the region 300 is smaller than a width $W_2$ of the die 120. In other words, boundaries of the region 300 are within the boundaries (e.g., sidewalls) of the die 120. An offset P (e.g., distance) between the boundary of the region 300 and the boundary of the die 120 may be between about 100 µm and about 200 µm, in some embodiments, although other dimensions are possible and are fully intended to be included within the scope of the present disclosure. The offset P is chosen to accommodate inaccuracies in the laser drilling process or the etching process used to form the openings 116B, in some embodiments. Therefore, in the illustrated example of FIG. 6, portions of the adhesive film 118 with a width P are disposed between the redistribution structure 110 and the dummy metal layer 123. In other embodiments, the width $W_1$ of the region 300 is equal to the width $W_2$ of the die 120, and therefore, boundaries of the region 300 are aligned with the boundaries of the die 120 (e.g., P=0).

Figure 7:
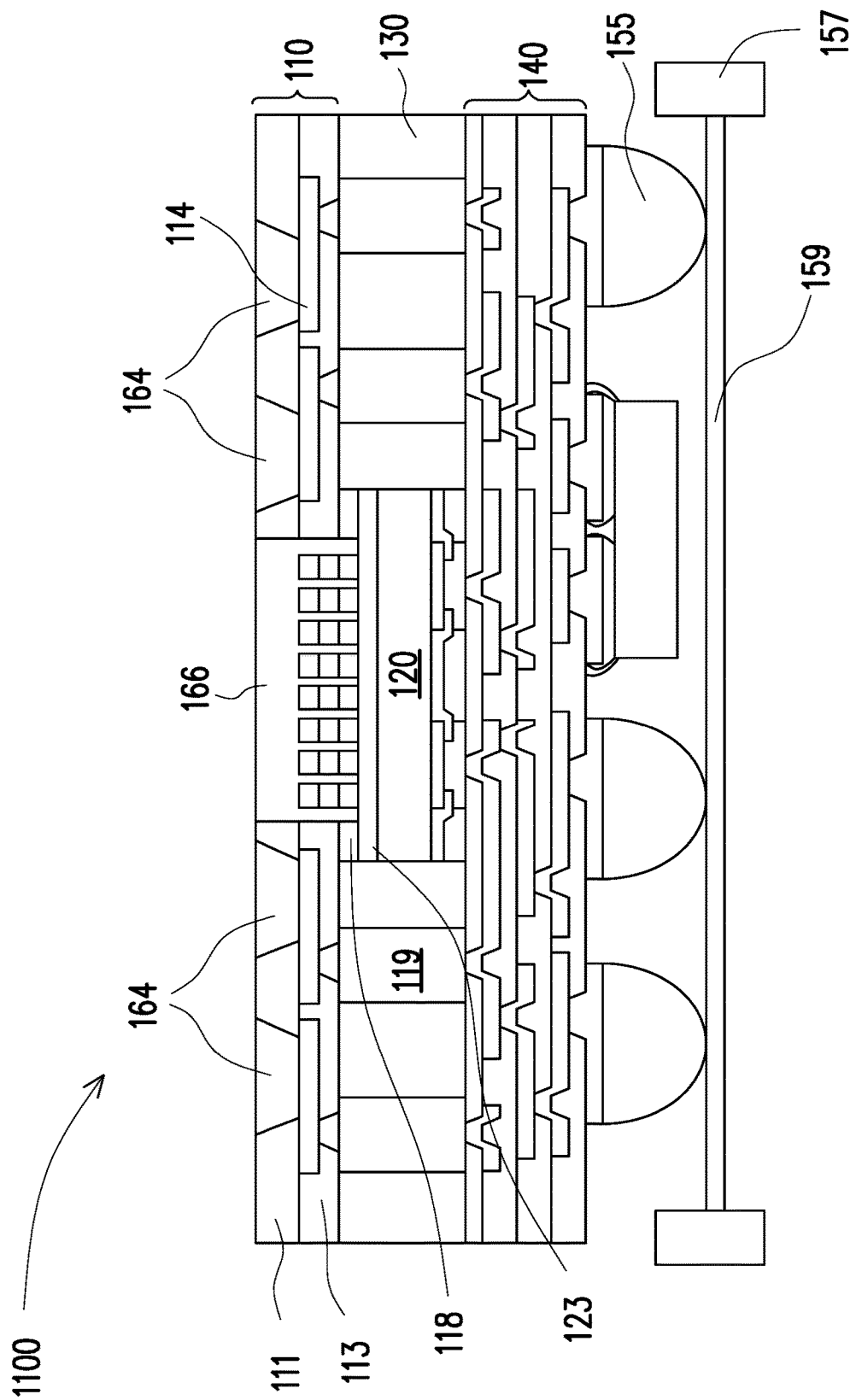

Next, in FIG. 7, a solder paste 164 is formed in the openings 116A (see FIG. 6), and a thermally conductive material 166 is formed in the openings 116B (see FIG. 6). The thermally conductive material 166 is a metal paste that may comprise an adhesive material such as epoxy with metal fillers (e.g., silver particles, copper particles) dispersed therein, and therefore, the thermally conductive material 166 is electrically conductive, in the illustrated embodiment. The adhesive material (e.g., epoxy) may also be referred to as a solvent for the metal fillers. In some embodiments, the thermally conductive material 166 comprises an electrically conductive material (e.g., copper, aluminum, silver) that has good thermal conductivity (e.g., larger than 15 watts per meter-kelvin (W/(m–k))) and high heat capacity (e.g. about 1 joules per gram per degree Celsius (J/(g° C.)) or larger). The thermally conductive material 166 may be formed by, e.g., depositing a metal paste in the openings 116B, although depending on the composition (e.g., material) of the thermally conductive material 166, other suitable method, such as CVD, sputtering, plating, dispensing, jetting, printing, thermal bonding may also be used to form the thermally conductive material 166. In some embodiments, the thermally conductive material 166 is a dielectric material having good thermal conductivity (e.g., larger than 15 W/(m–k)) and high heat capacity (e.g. about 1 J/(g° C.) or larger).

In the various embodiments discussion herein, metal paste is used as the thermally conductive material 166, and therefore, the thermally conductive material 166 may also be referred to as metal paste 166, with the understanding that besides metal paste, any suitable thermally conductive material may be used without departing from the spirit of the present disclosure.

In some embodiments, the metal paste 166 has a higher thermal conductivity than the adhesive film 118 and the dielectric material (e.g., polymer) of the redistribution structure 110. For example, the metal paste may have a thermal conductivity between about 15 W/(m–k) and about 30 W/(m–k). In contrast, the adhesive film 118 (e.g., DAF) and the dielectric material(s) (e.g., polymer) of the redistribution structure 110 have much lower thermal conductivities. For example, the thermal conductivity of the DAF used as the adhesive film 118 may be about 0.2 W/(m–k). The thermal conductivity range (e.g., about 15 W/(m–k) to about 30 W/(m–k)) disclosed above is merely a non-limiting examples, other suitable thermal conductivity ranges (see discussion below) are also possible and are fully intended to be included within the scope of the present disclosure.

In some embodiments, the metal paste 166 is different from the solder paste 164, and comprises copper paste, silver paste, or other metal paste that has a higher thermal conductivity than the solder paste 164. For example, silver paste has a thermal conductivity of between about 15 W/(m–k) and about 95 W/(m–k), and solder paste has a thermal conductivity of between about 35 W/(m–k) and about 65 W/(m–k). In other embodiments, the metal paste 166 is the same as the solder paste 164. That is, solder paste is used to fill both the openings 116A and the openings 116B. Since the metal paste 166 (e.g., silver paste, copper paste, or solder paste) have higher thermal conductivity than the adhesive film 118 and the dielectric material (e.g., polymer) of the redistribution structure 110, by replacing portions of the adhesive film 118 and replacing portions of the dielectric material of the redistribution structure 110 with the metal paste 166, heat dissipation of the die 120 can be greatly improved, thereby improving the reliability and performance of the semiconductor package formed.

Figure 8:
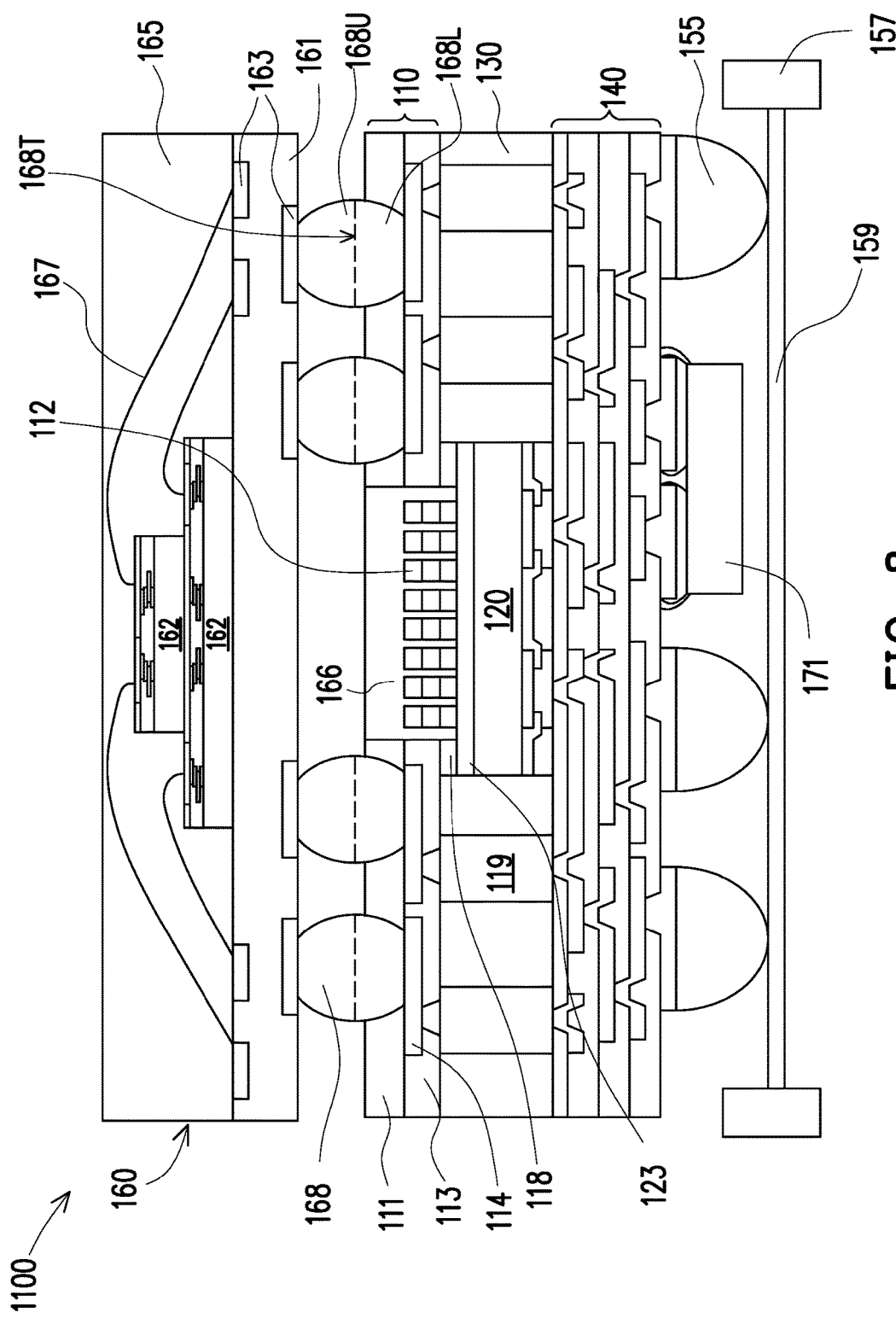

Referring next to FIG. 8, a semiconductor package 160 (also referred to as a top package), such as a package comprising memory devices, is attached to the semiconductor package 1100 shown in FIG. 7 (also referred to as a bottom package) to form the semiconductor package 1100 in FIG. 8, thereby forming a semiconductor package 1100 with a package-on-package (PoP) structure.

As illustrated in FIG. 8, the semiconductor package 160 has a substrate 161 and one or more semiconductor dies 162 (e.g., memory dies) attached to an upper surface of the substrate 161. In some embodiments, the substrate 161 includes silicon, gallium arsenide, silicon on insulator ("SOI") or other similar materials. In some embodiments, the substrate 161 is a multiple-layer circuit board. In some embodiments, the substrate 161 includes bismaleimide triazine (BT) resin, FR-4 (a composite material composed of woven fiberglass cloth with an epoxy resin binder that is flame resistant), ceramic, glass, plastic, tape, film, or other supporting materials. The substrate 161 may include conductive features (e.g., conductive lines and vias, not shown) formed in/on the substrate 161. As illustrated in FIG. 8, the substrate 161 has conductive pads 163 formed on the upper surface and a lower surface of the substrate 161, which conductive pads 163 are electrically coupled to the conductive features of the substrate 161. The one or more semiconductor dies 162 are electrically coupled to the conductive pads 163 by, e.g., bonding wires 167. A molding material 165, which may comprise an epoxy, an organic polymer, a polymer, or the like, is formed over the substrate 161 and around the semiconductor dies 162. In some embodiments, the molding material 165 may be conterminous with the substrate 161, as illustrated in FIG. 8.

In some embodiments, a reflow process is performed to electrically and mechanically coupled the semiconductor package 160 to the redistribution structure 110. Conductive joints 168, which may be formed by bonding external connectors of the semiconductor package 160 with melted solder paste 164, are formed between the conductive pads 163 and the conductive feature 114. FIG. 8 illustrates interfaces 168T between upper portions 168U of the conductive joints 168 and lower portions 168L of the conductive joints 168, where the upper portions 168U may correspond to at least portions of the external connectors of the semiconductor package 160 and the lower portions 168L may correspond to at least portions of the solder paste (e.g., 164 in FIG. 7) used to form the conductive joint 168. For simplicity, the interfaces 168T may not be illustrated in subsequent drawings. In some embodiments, the conductive joints 168 comprise solder regions, conductive pillars (e.g., copper pillars with solder regions on at least end surfaces of the copper pillars), or any other suitable conductive joints.

In some embodiments, the reflow process also cures (e.g., hardens) the metal paste 166 such that the metal paste 166 turns into a cured metal paste 166. As illustrated in FIG. 8, the cured metal paste 166 fills the openings 116B (see FIG. 6) and physically contacts the dummy metal layer 132 on the backside of the die 120. In FIG. 8, a lowermost surface of the cured metal paste 166, which is the surface physically contacting the dummy metal layer 123, is closer to the die 120 than a lower surface of the redistribution structure 110 facing the die 120. In some embodiments, after the reflow process, the cured metal paste 166, the dummy metal patterns 112, and the dummy metal layer 123 are connected together to form a thermally conductive feature that is electrically isolated, which thermally conductive feature functions as a heat dissipation structure for the semiconductor package 1100, and therefore, may also be referred to as a heat dissipation structure. In other embodiments of the present disclosure, as will be discussed hereinafter, the dummy metal patterns 112 and/or the dummy metal layer 123 may be omitted, in which case the heat dissipation structure may include the cured metal paste 166, the cured metal paste 166 and the dummy metal patterns 112, or the cured metal paste 166 and the dummy metal layer 123.

In the example of FIG. 8, the upper surface of the cured metal paste 166 is level with an upper surface 111U of a topmost dielectric layer (e.g., 111) of the redistribution structure 110. As will be discussed hereinafter, the upper surface of the cured metal paste 166 may also be higher (e.g., further from the die 120) than or lower (e.g., closer to the die 120) than the upper surface 111U.

Although not shown, a dicing process may be performed after the conductive joints 168 are formed to separate the semiconductor package 1100 from other neighboring semiconductor packages (not shown) formed in the same processing steps, thereby forming a plurality of individual semiconductor packages 1100. The individual semiconductor packages 1100 may then be removed from the tape 159.

Figure 9:
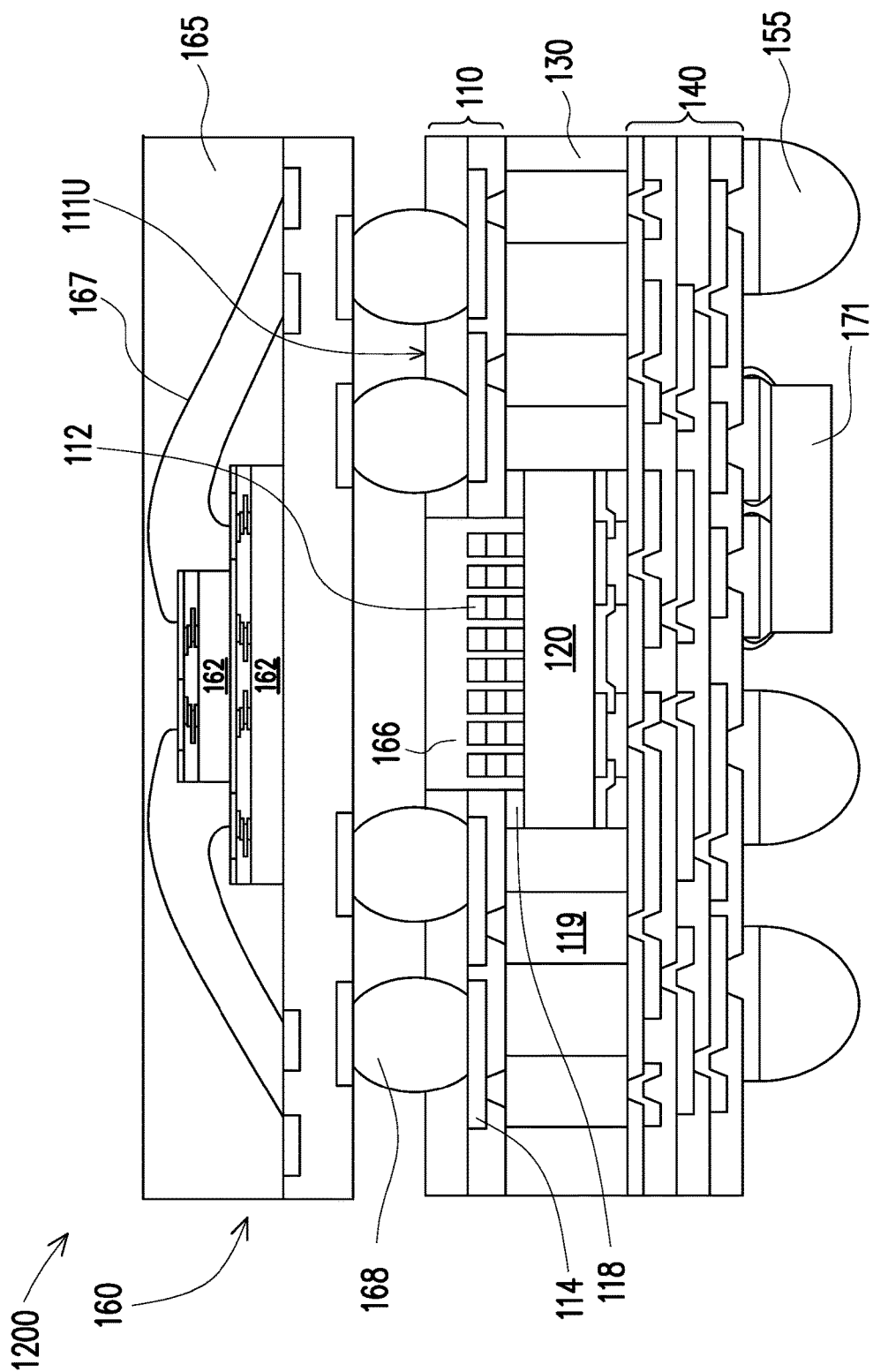
FIGS. 9-11, 12A, 12B, 13-15, 16A, 16B, 17-23 illustrates cross-sectional views of various semiconductor packages, in accordance with various embodiments.
Figure 10:
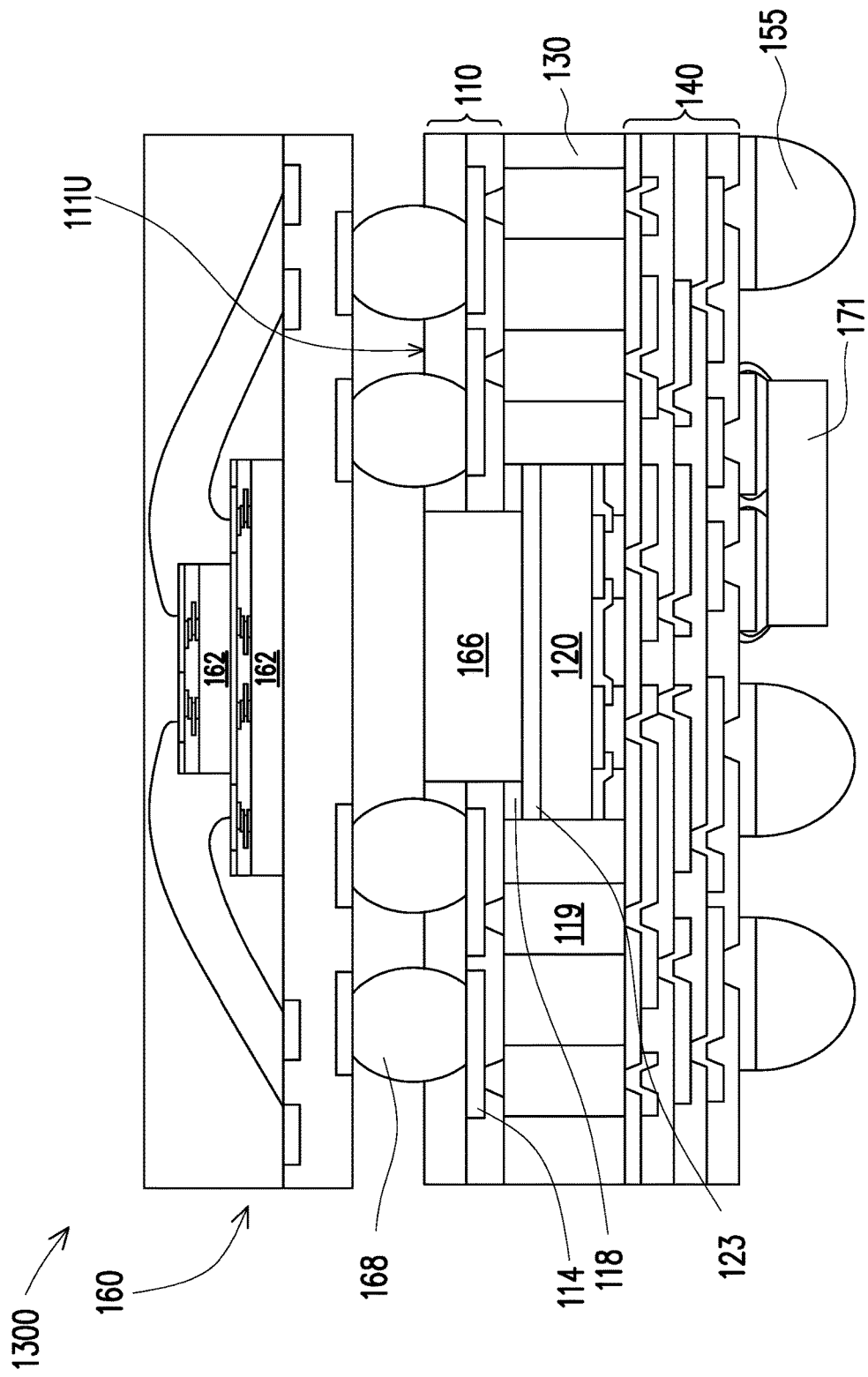
Figure 11:
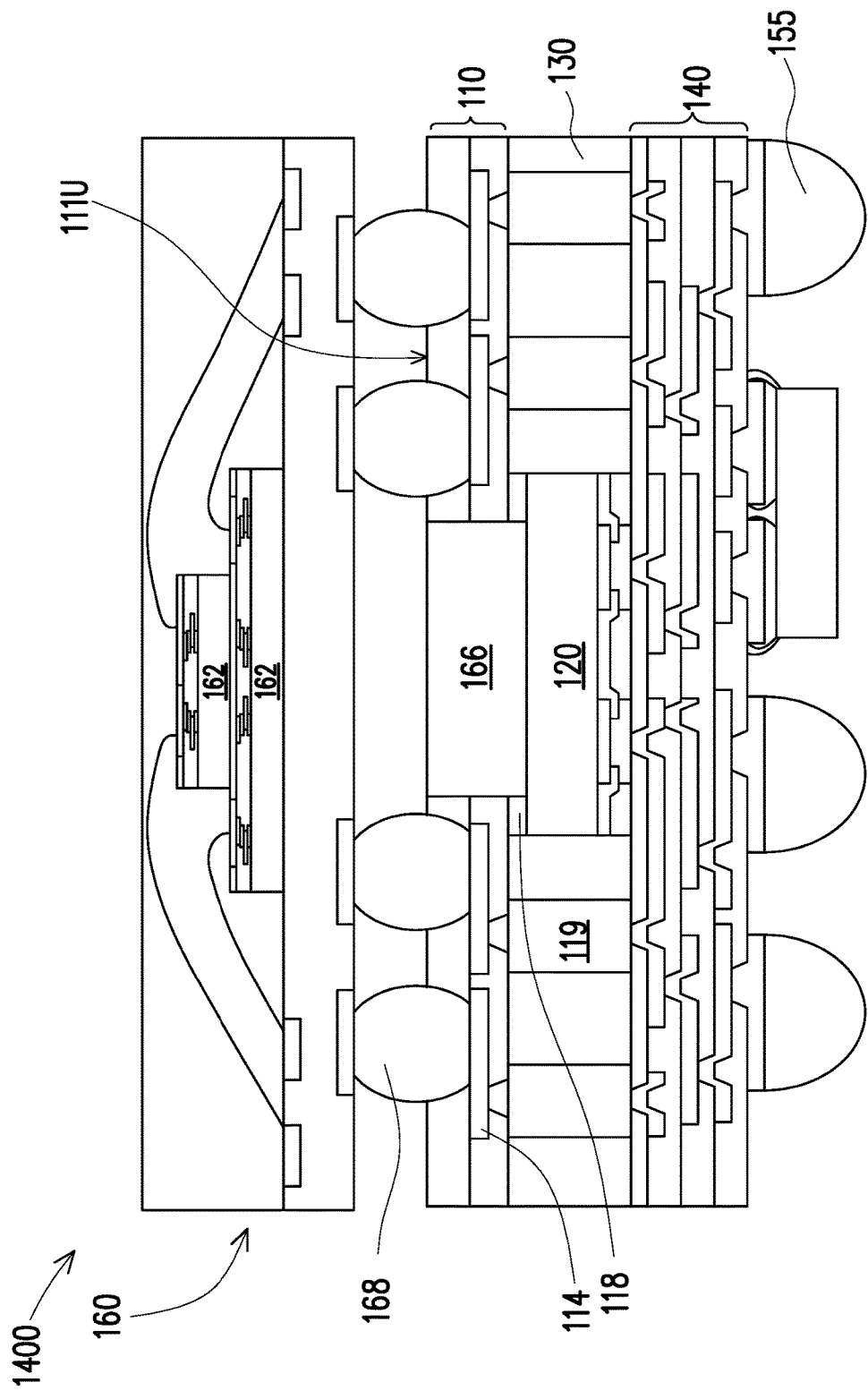

FIGS. 9-11 illustrate cross-sectional views of semiconductor packages in accordance with various embodiments of the present disclosure. In FIGS. 9-11, unless otherwise specified, similar numerals refer to similar parts in FIGS. 1-8. For example, components with the same numerals may be formed of the same or similar material, and may be formed using the same or similar formation method. For simplicity, details may not be repeated.

FIG. 9 illustrates a cross-sectional view of a semiconductor package 1200 that is similar to the semiconductor package 1100 of FIG. 8, but without the dummy metal layer 123 on the backside of the die 120. Therefore, the processing shown in FIGS. 1-8 are performed accordingly without the dummy metal layer 123. For example, during formation of the openings 116B (see FIG. 6), the openings 116B are formed to expose portions of the backside of the die 120 since the dummy metal layer 123 is omitted. As illustrated in FIG. 9, the cured metal paste 166 physically contacts the backside of the die 120. In the example of FIG. 9, the upper surface of the cured metal paste 166 is level with the upper surface 111U of the topmost dielectric layer (e.g., 111) of the redistribution structure 110. As will be discussed hereinafter, the upper surface of the cured metal paste 166 may also be higher than or lower than the upper surface 111U.

FIG. 10 illustrates a cross-sectional view of a semiconductor package 1300 that is similar to the semiconductor package 1100 of FIG. 8, except that the redistribution structure 110 does not have the dummy metal patterns 112. For example, no metal pattern (dummy or not) is formed in the region (see, e.g., region 300 in FIG. 6) of the redistribution structure 110 directly over the die 120. In the illustrated embodiment, portions of the redistribution structure 110 directly over the die 120 is removed to form a through-hole, and the through-hole is filled with the metal paste 166. As illustrated in FIG. 10, the cured metal paste 166 physically contacts the dummy metal layer 123 on the backside of the die 120. In the example of FIG. 10, the upper surface of the cured metal paste 166 is level with the upper surface 111U of the topmost dielectric layer (e.g., 111) of the redistribution structure 110. As will be discussed hereinafter, the upper surface of the cured metal paste 166 may also be higher than or lower than the upper surface 111U.

FIG. 11 illustrates a cross-sectional view of a semiconductor package 1400 that is similar to the semiconductor package 1300 of FIG. 10, but without the dummy metal layer 123 on the backside of the die 120. As illustrated in FIG. 11, the cured metal paste 166 physically contacts the backside of the die 120. In the example of FIG. 11, the upper surface of the cured metal paste 166 is level with the upper surface 111U of the topmost dielectric layer (e.g., 111) of the redistribution structure 110. As will be discussed hereinafter, the upper surface of the cured metal paste 166 may also be higher than or lower than the upper surface 111U.

Variations of the disclosed embodiments are possible and are fully intended to be included within the scope of the present disclosure. For example, the amount of the metal paste 166 may be adjusted such that after the reflow process, the upper surface of the cured metal paste 166 may be level with (as illustrated in FIG. 6), higher (e.g., further from the die 120) than, or lower (e.g., closer to the die 120) than the upper surface 111U of the top dielectric layer (e.g., 111) of the redistribution structure 110. In addition, an underfill material may be formed in the gap between the semiconductor package 160 and the redistribution structure 110. The underfill material may be a continuous underfill material (see, e.g., 169 in FIGS. 12A and 12B), or may comprise discrete (e.g., physically separated) portions of underfill material (see, e.g., 169 in FIGS. 16A and 16B). By combining the different variations of features (e.g., locations of the upper surface of the cured metal paste 166, and shapes of the underfill material 169) discussed above with each of the disclosed embodiments in FIGS. 8-11, additional embodiments may be derived. Some, but not all, of the additional embodiments are illustrated in FIGS. 12A, 12B, 13-15, 16A, 16B, and 17-23.

FIGS. 12A, 12B, and 13-15 illustrate cross-sectional views of semiconductor packages in accordance with various embodiments of the present disclosure. In FIGS. 12A, 12B, and 13-15, unless otherwise specified, similar numerals refer to similar parts in FIGS. 1-11. For example, components with the same numerals may be formed of the same or similar material, and may be formed using the same or similar formation method. For simplicity, details may not be repeated.

Figure 12A:
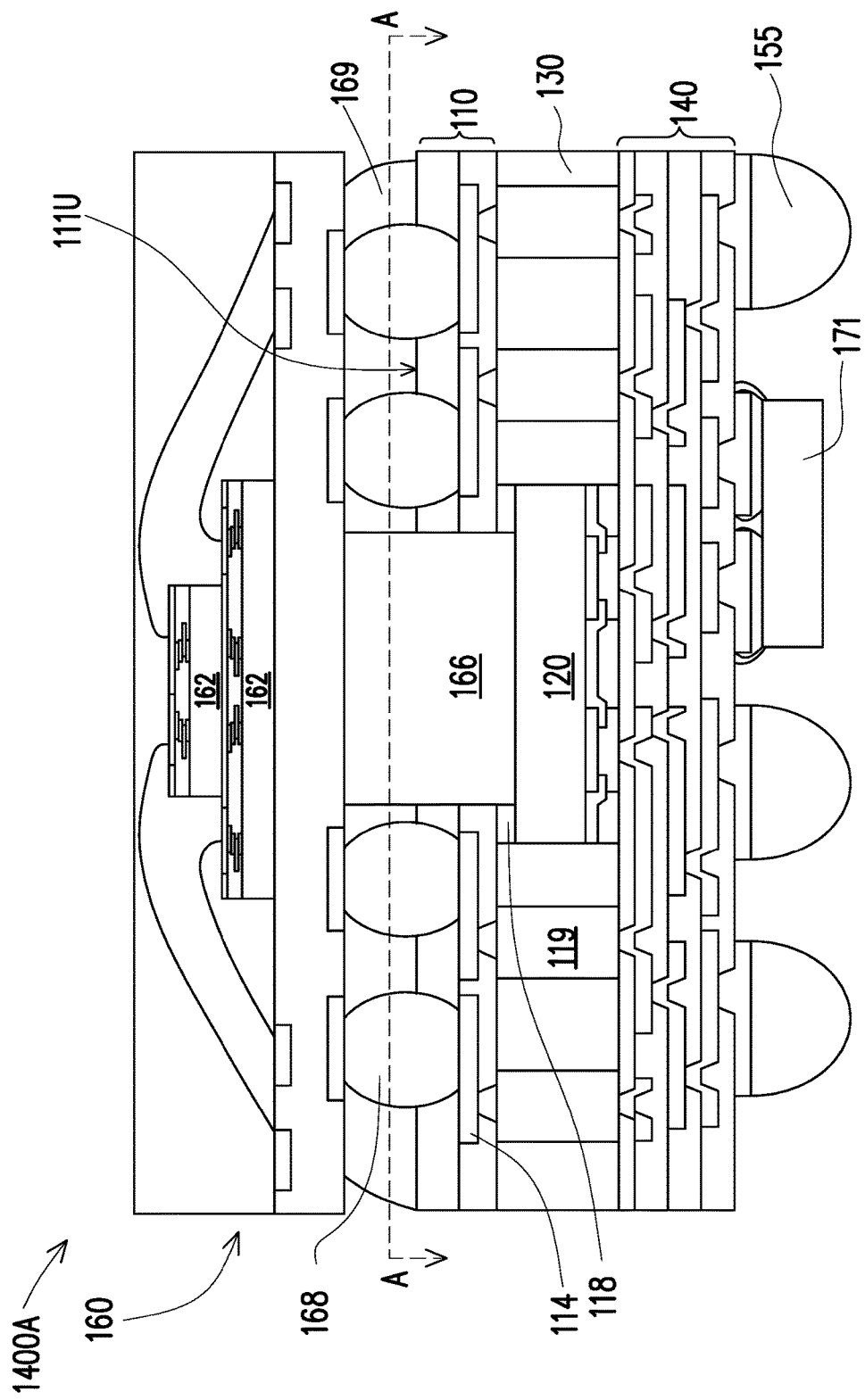
Figure 12B:
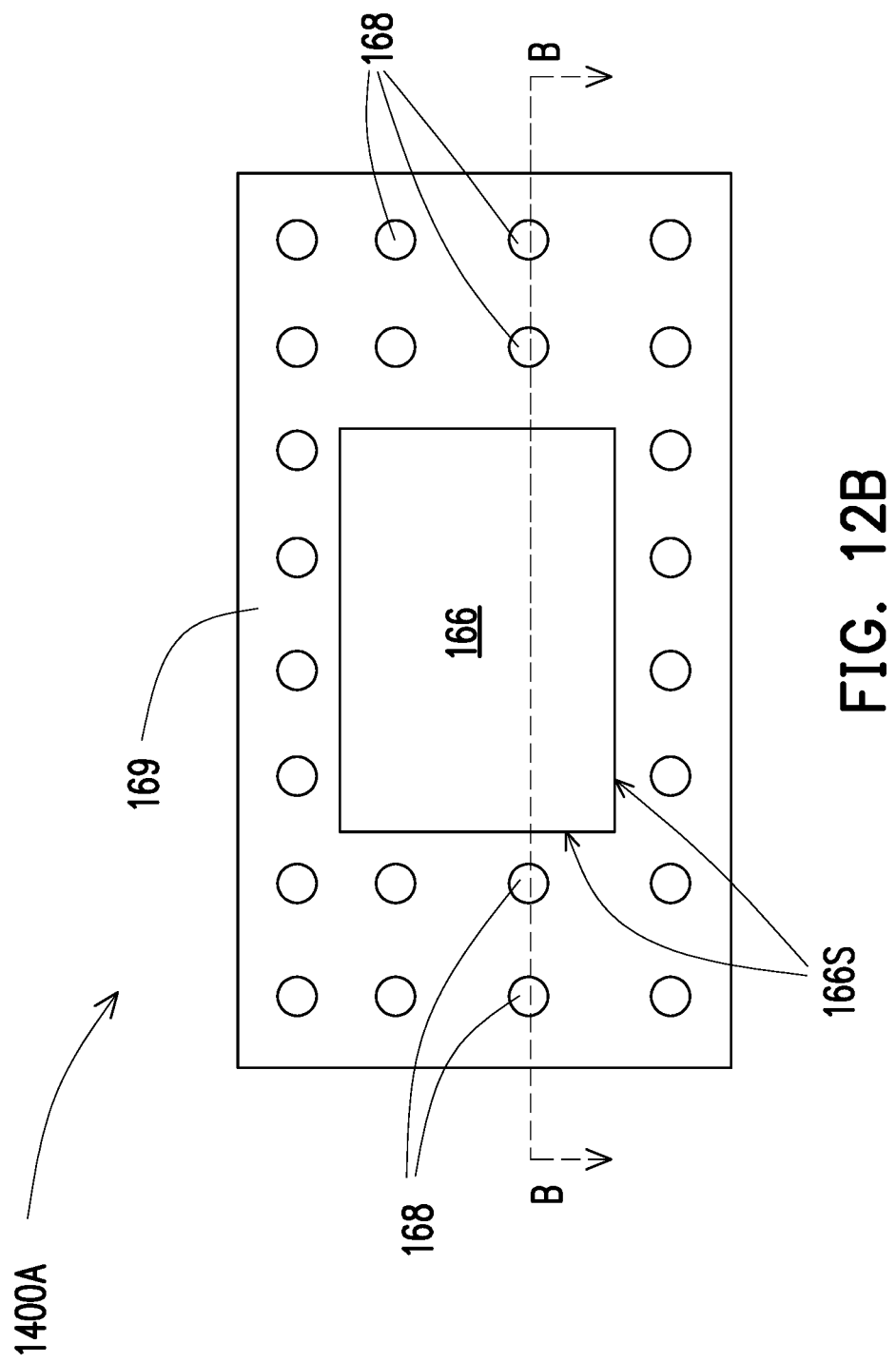

FIG. 12A illustrates a cross-sectional view of a semiconductor package 1400A that is similar to the semiconductor package 1400 of FIG. 11, but with the amount (e.g., volume) of the metal paste 166 adjusted (e.g., increased) and with an underfill material 169 formed in the gap between the semiconductor package 160 and the redistribution structure 110. FIG. 12B is a cross-sectional view of the semiconductor package 1400A in FIG. 12A along line A-A, and FIG. 12A is a cross-sectional view of the semiconductor package 1400A in FIG. 12B along line B-B.

As illustrated in FIG. 12A, the cured metal paste 166 extends continuously from the backside of the die 120 to the substrate 161 of the semiconductor package 160. In other words, the cured metal paste 166 physically contacts the die 120 and the substrate 161. FIG. 12A also illustrates an underfill material 169 in the gap between the semiconductor package 160 and the redistribution structure 110. Example materials of the underfill material 169 include, but are not limited to, epoxy, polymers, and other suitable dielectric materials. The underfill material 169 may be dispensed in the gap between semiconductor package 160 and the redistribution structure 110 using, e.g., a needle or a jetting dispenser. A curing process may be performed to cure the underfill material 169. The cured metal paste 166 may be used to control the standoff height of the conductive joints 168.

Figure 13:
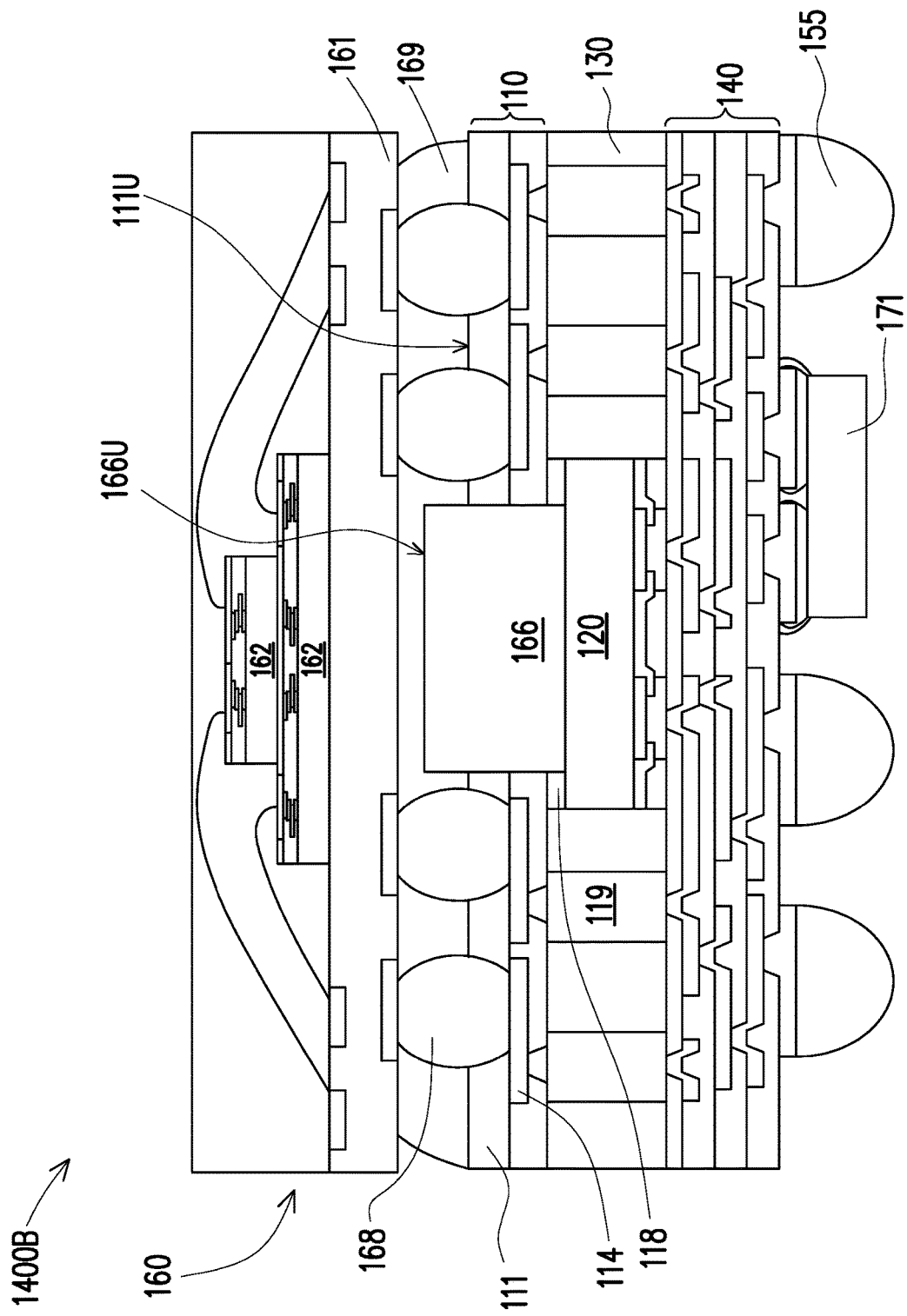
Figure 14:
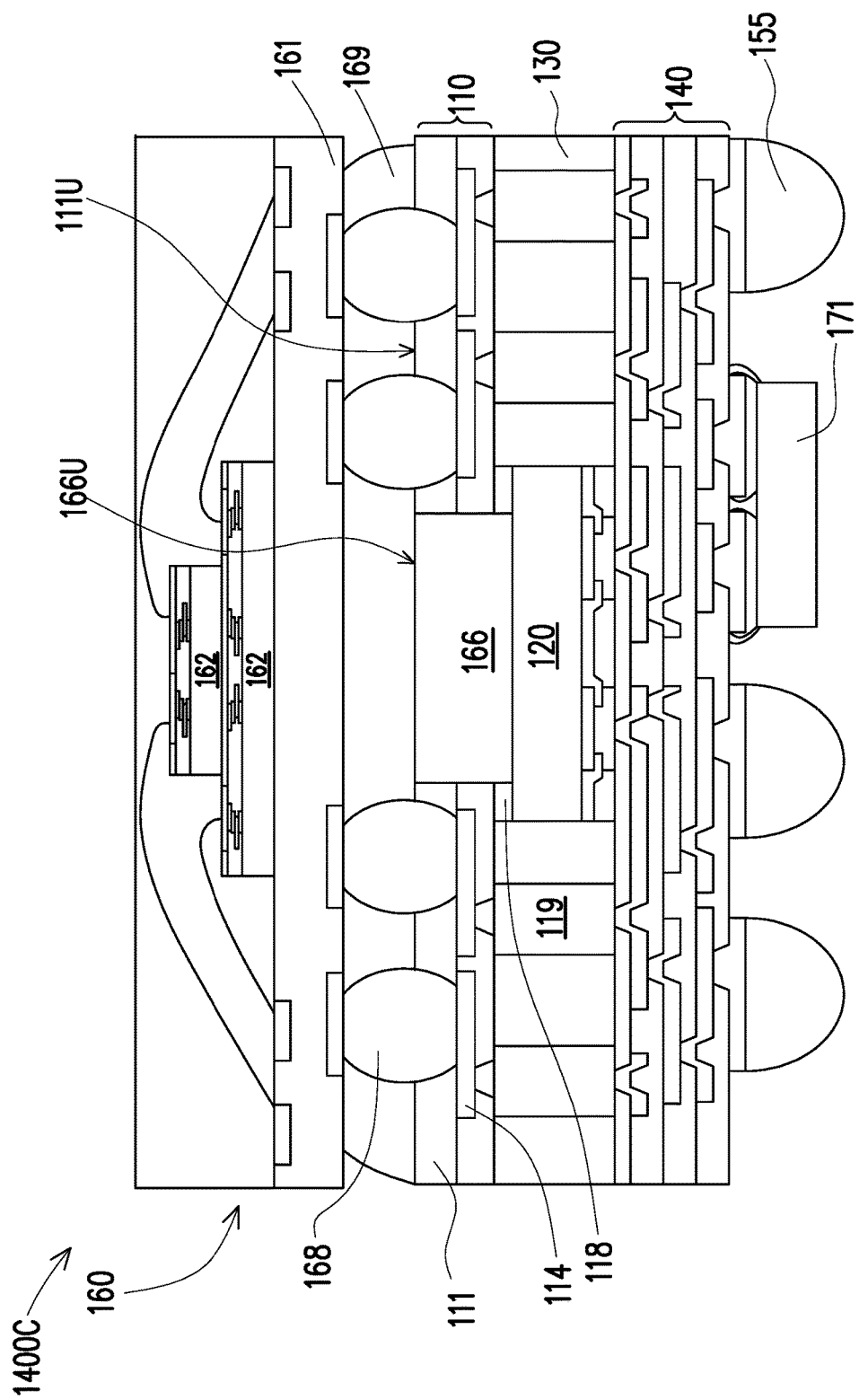
Figure 15:
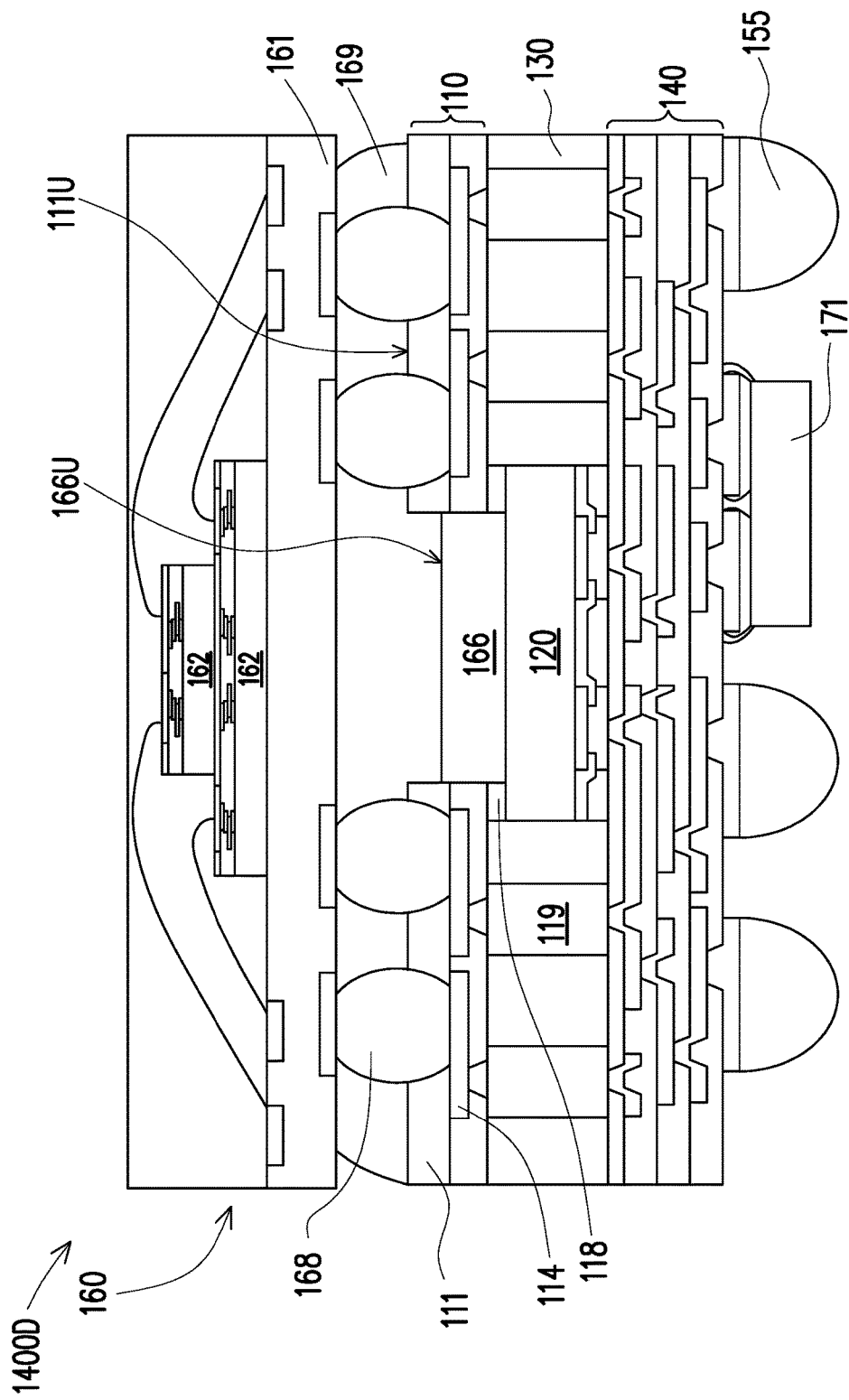

Referring now to FIG. 12B, the underfill material 169 extends continuously from one conductive joint 168 to another conductive joint 168. In addition, the underfill material 169 extends continuously along sidewalls 166S of the cured metal paste 166. Therefore, the underfill material 169 is continuous volume of dielectric material. In other words, the underfill material 169 is comprised of a continuous dielectric material (e.g., epoxy, polymer). The number of conductive joints 168 illustrated in FIGS. 12A and 12B are illustrative and not limiting. Other numbers are also possible and are fully intended to be included within the scope of the present disclosure FIGS. 13-15 illustrate cross-sectional view of semiconductor packages 1400B, 1400C and 1400D, respectively, that are similar to the semiconductor package 1400A of FIG. 12A, but with the amount (e.g., volume) of the metal paste 166 adjusted (e.g., decreased), such that an upper surface 166U of the cured metal paste 166 is below, therefore does not contact, the substrate 161 of the semiconductor package 160. In particular, in FIG. 13, the upper surface 166U of the cured metal paste 166 is between the substrate 161 and the upper surface 111U of the top dielectric layer (e.g., 111) of the redistribution structure 110. In FIG. 14, the upper surface 166U of the cured metal paste 166 is level with the upper surface 111U of the top dielectric layer (e.g., 111) of the redistribution structure 110. In FIG. 15, the upper surface 166U of the cured metal paste 166 is closer to the die 120 than the upper surface 111U of the top dielectric layer (e.g., 111) of the redistribution structure 110. As illustrated in FIG. 15, a portion of the underfill material 169 directly over the die 120 is closer to the die 120 than portions of the underfill material 169 not directly over the die 120 (e.g., portions contacting the conductive joints 168).

FIGS. 16A, 16B, and 17-19 illustrate cross-sectional views of semiconductor packages in accordance with various embodiments of the present disclosure. In FIGS. 16A, 16B, and 17-19, unless otherwise specified, similar numerals refer to similar parts in FIGS. 1-11. For example, components with the same numerals may be formed of the same or similar material, and may be formed using the same or similar formation method. For simplicity, details may not be repeated.

Figure 16A:
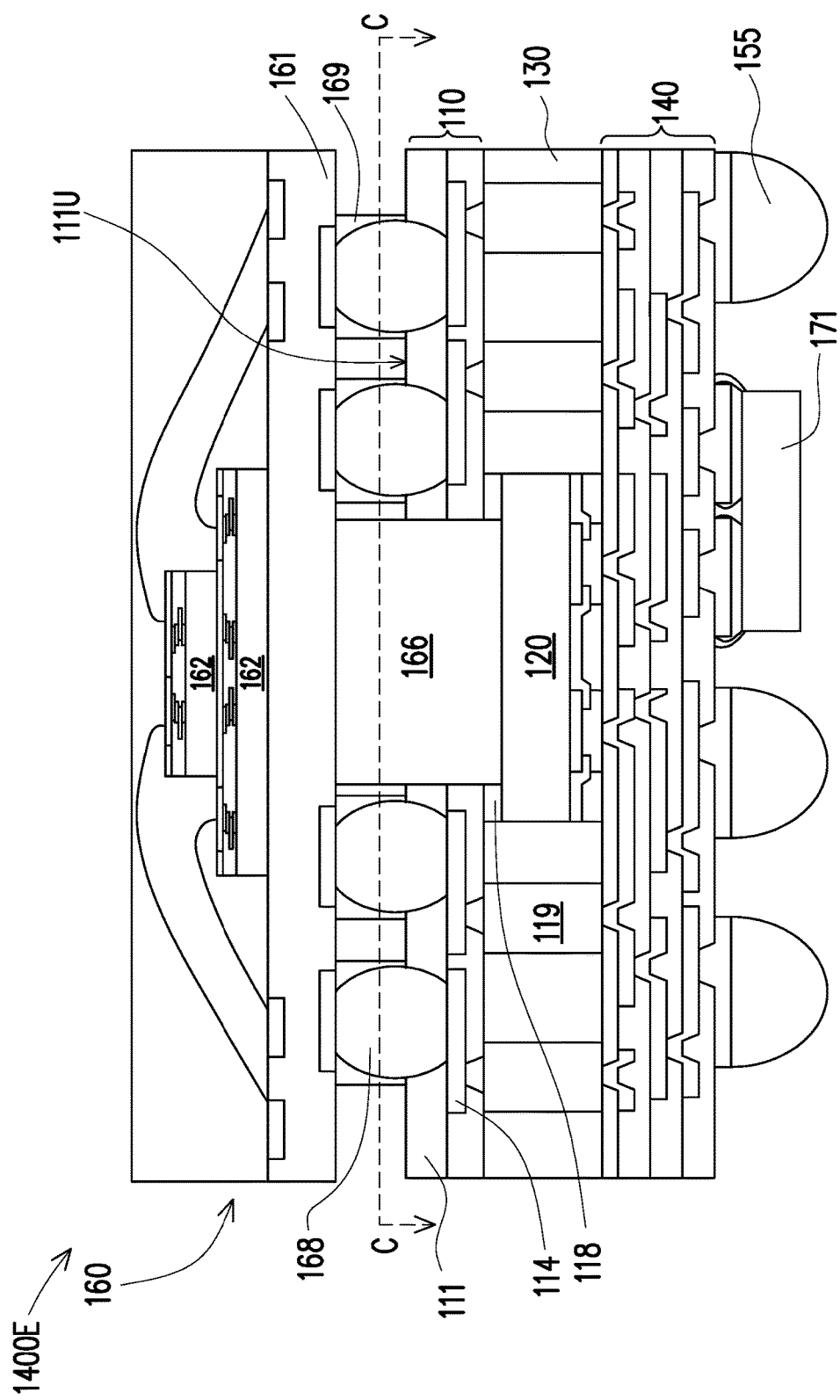
Figure 16B:
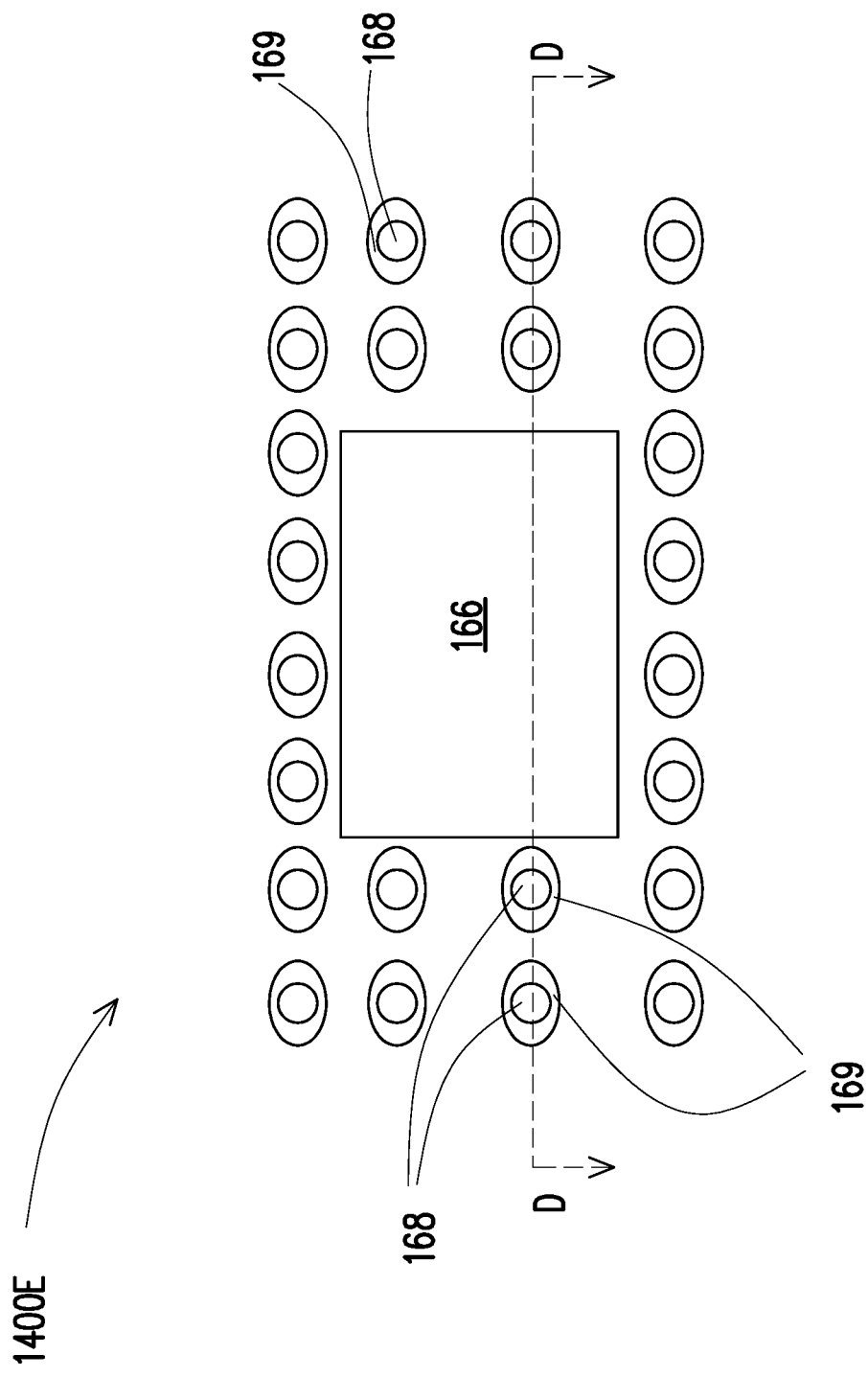

FIG. 16A illustrates a cross-sectional view of a semiconductor package 1400E that is similar to the semiconductor package 1400A of FIG. 12A, but with the underfill material 169 comprising discrete (e.g., physically separated) portions that are formed around the conductive joints 168. FIG. 16B is a cross-sectional view of the semiconductor package 1400E in FIG. 16A along line C-C, and FIG. 16A is a cross-sectional view of the semiconductor package 1400E in FIG. 16B along line D-D.

As illustrated in FIG. 16A, the cured metal paste 166 extends continuously from the backside of the die 120 to the substrate 161 of the semiconductor package 160. In other words, the cured metal paste 166 physically contacts the die 120 and the substrate 161. FIG. 16A also illustrates the underfill material 169 in the gap between the semiconductor package 160 and the redistribution structure 110. The underfill material 169 may be formed by applying an epoxy flux on the external connectors of the semiconductor package 160 prior to the reflow process used to bond the external connectors of semiconductor package 160 to the conductive features 114 of the redistribution structure 110. For example, the external connectors of the semiconductor package 160 may be dipped into the epoxy flux prior to the reflow process. After the reflow process, the epoxy flux is cured and forms individual portions of the underfill material 169 that are physically separated from each other, as illustrated in FIG. 16B.

Referring now to FIG. 16B, each individual portion of the underfill material 169 surrounds a respective conductive joint 168, and is physically separated from another portion of the underfill material 169 around another conductive joint 168. The number of conductive joints 168 and the number of individual portions of the underfill material 169 illustrated in FIGS. 16A and 16B are illustrative and not limiting. Other numbers are also possible and are fully intended to be included within the scope of the present disclosure.

Figure 17:
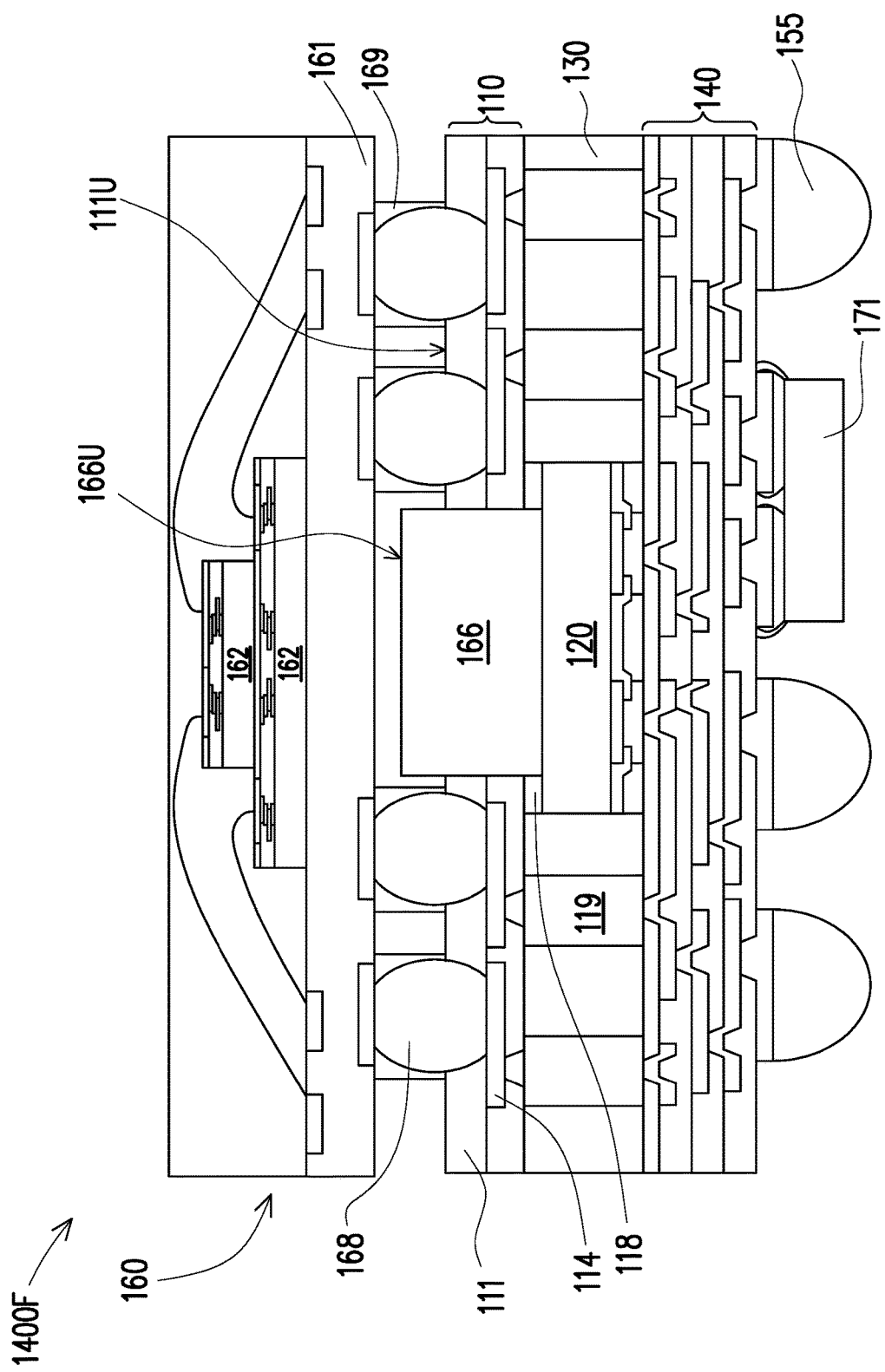
Figure 18:
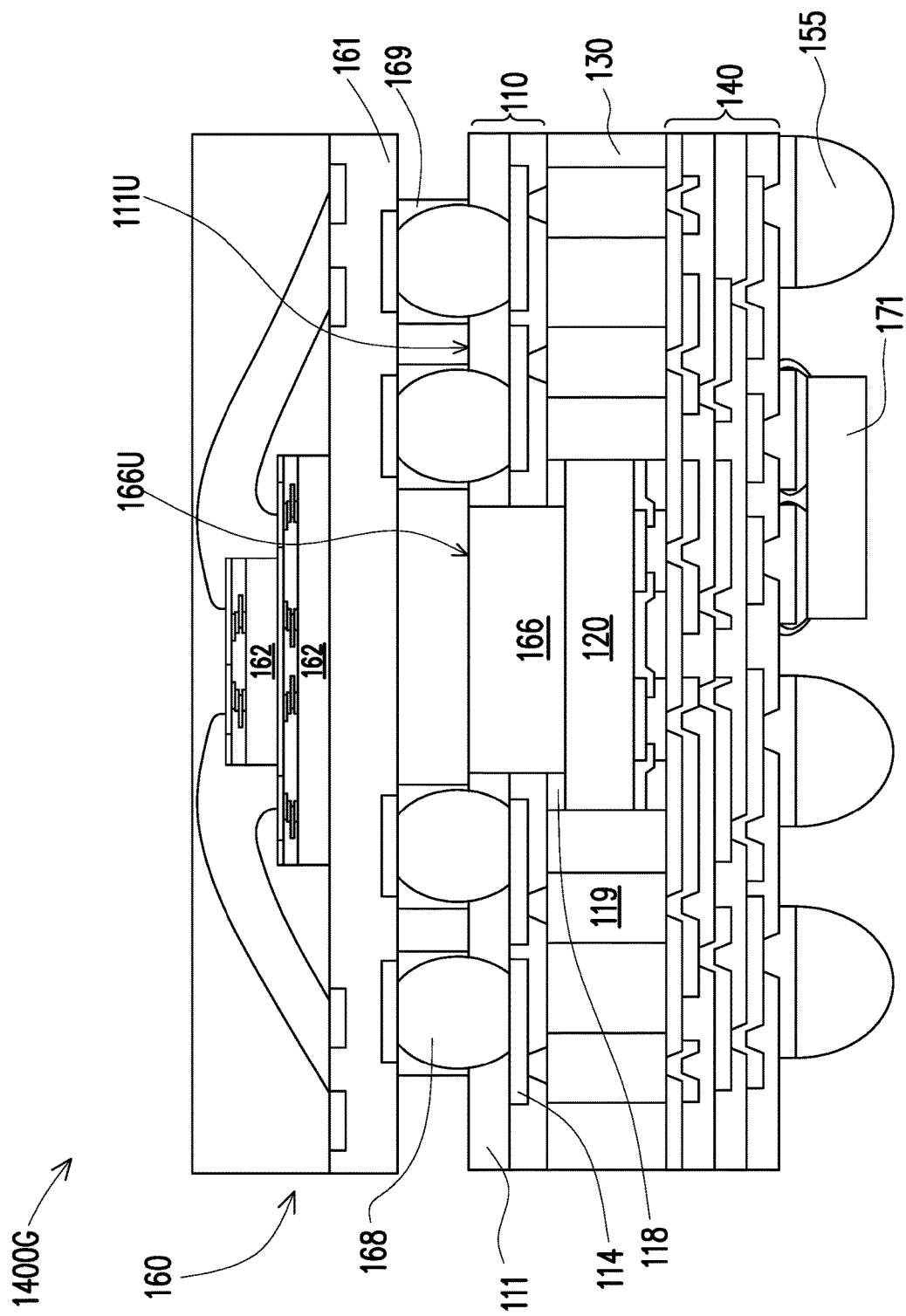
Figure 19:
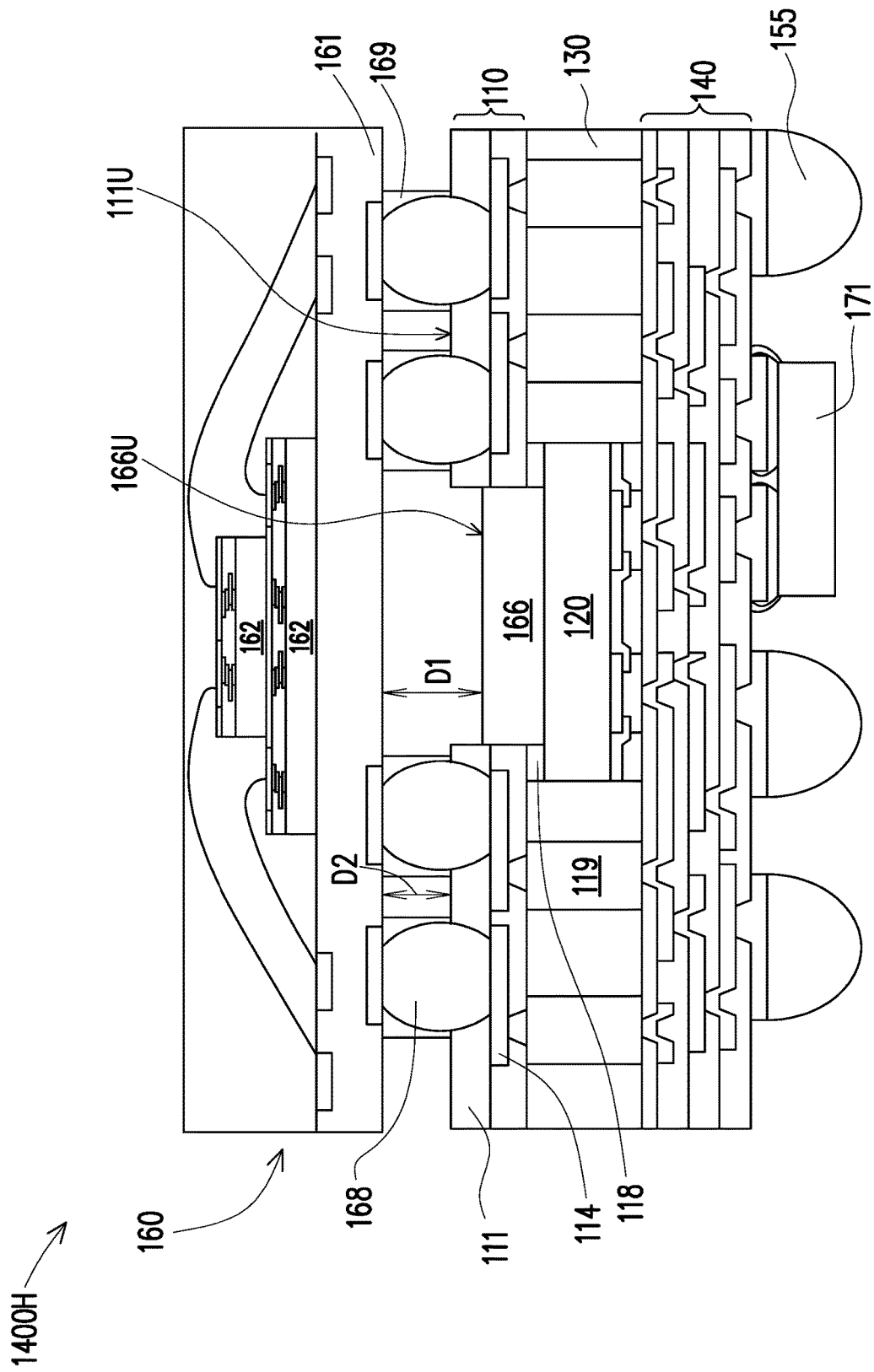

FIGS. 17-19 illustrate cross-sectional view of semiconductor packages 1400F, 1400G and 1400H, respectively, that are similar to the semiconductor package 1400E of FIG. 16A, but with the amount (e.g., volume) of the metal paste 166 adjusted (e.g., decreased), such that an upper surface 166U of the cured metal paste 166 is below, therefore does not contact, the substrate 161 of the semiconductor package 160. In particular, in FIG. 17, the upper surface 166U of the cured metal paste 166 is between the substrate 161 and the upper surface 111U of the top dielectric layer (e.g., 111) of the redistribution structure 110. In FIG. 18, the upper surface 166U of the cured metal paste 166 is level with the upper surface 111U of the top dielectric layer (e.g., 111) of the redistribution structure 110. In FIG. 19, the upper surface 166U of the cured metal paste 166 is closer to the die 120 than the upper surface 111U of the top dielectric layer (e.g., 111) of the redistribution structure 110. As illustrated in FIG. 19, a distance $D_1$ between the cured metal paste 166 and the substrate 161 is larger than a distance $D_2$ between the substrate 161 and the upper surface 111U of the top dielectric layer (e.g., 111) of the redistribution structure 110.

FIGS. 20-23 illustrate cross-sectional views of semiconductor packages in accordance with various embodiments of the present disclosure. In FIGS. 20-23, unless otherwise specified, similar numerals refer to similar parts in FIGS. 1-11. For example, components with the same numerals may be formed of the same or similar material, and may be formed using the same or similar formation method. For simplicity, details may not be repeated.

Figure 20:
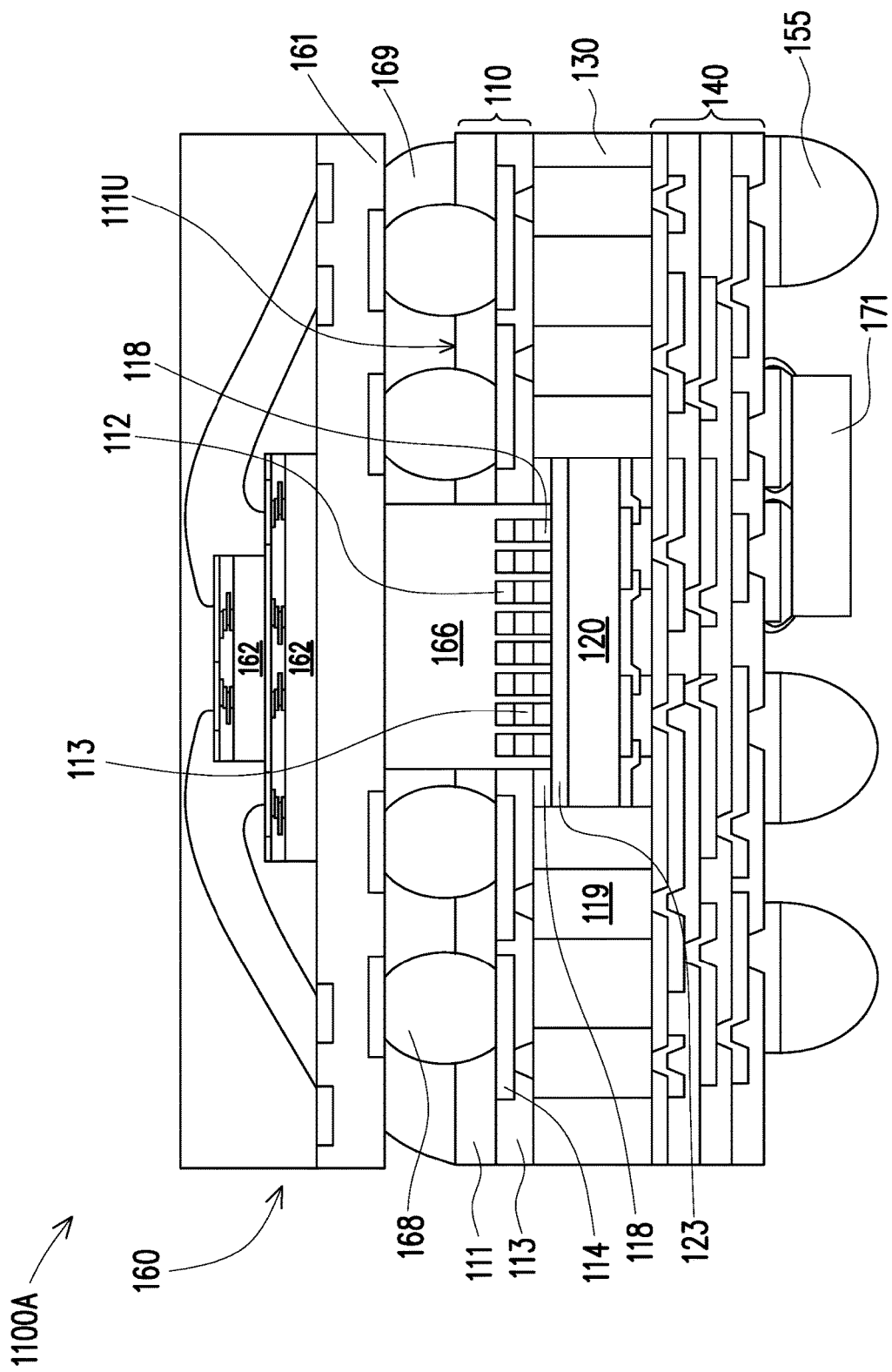

FIG. 20 illustrates a cross-sectional view of a semiconductor package 1100A that is similar to the semiconductor package 1100 of FIG. 8, but with the amount (e.g., volume) of the metal paste 166 adjusted (e.g., increased) and with an underfill material 169 formed in the gap between the semiconductor package 160 and the redistribution structure 110.

As illustrated in FIG. 20, the cured metal paste 166 extends continuously from the dummy metal layer 123 on the backside of the die 120 to the substrate 161 of the semiconductor package 160. In other words, the cured metal paste 166 physically contacts the dummy metal layer 123 and the substrate 161. FIG. 20 also illustrates the underfill material 169 in the gap between the semiconductor package 160 and the redistribution structure 110. Example materials of the underfill material 169 include, but are not limited to, epoxy, polymers, and other suitable non-conductive materials. The underfill material 169 may be dispensed in the gap between semiconductor package 160 and the redistribution structure 110 using, e.g., a needle or a jetting dispenser. A curing process may be performed to cure the underfill material 169. In some embodiments, the underfill material 169 extends continuously from one conductive joint 168 to another conductive joint 168. In addition, similar to FIG. 12B, the underfill material 169 extends continuously along sidewalls 166S of the cured metal paste 166. Therefore, the underfill material 169 is continuous. In other words, the underfill material 169 is comprised of one continuous dielectric material (e.g., epoxy, polymer).

Figure 21:
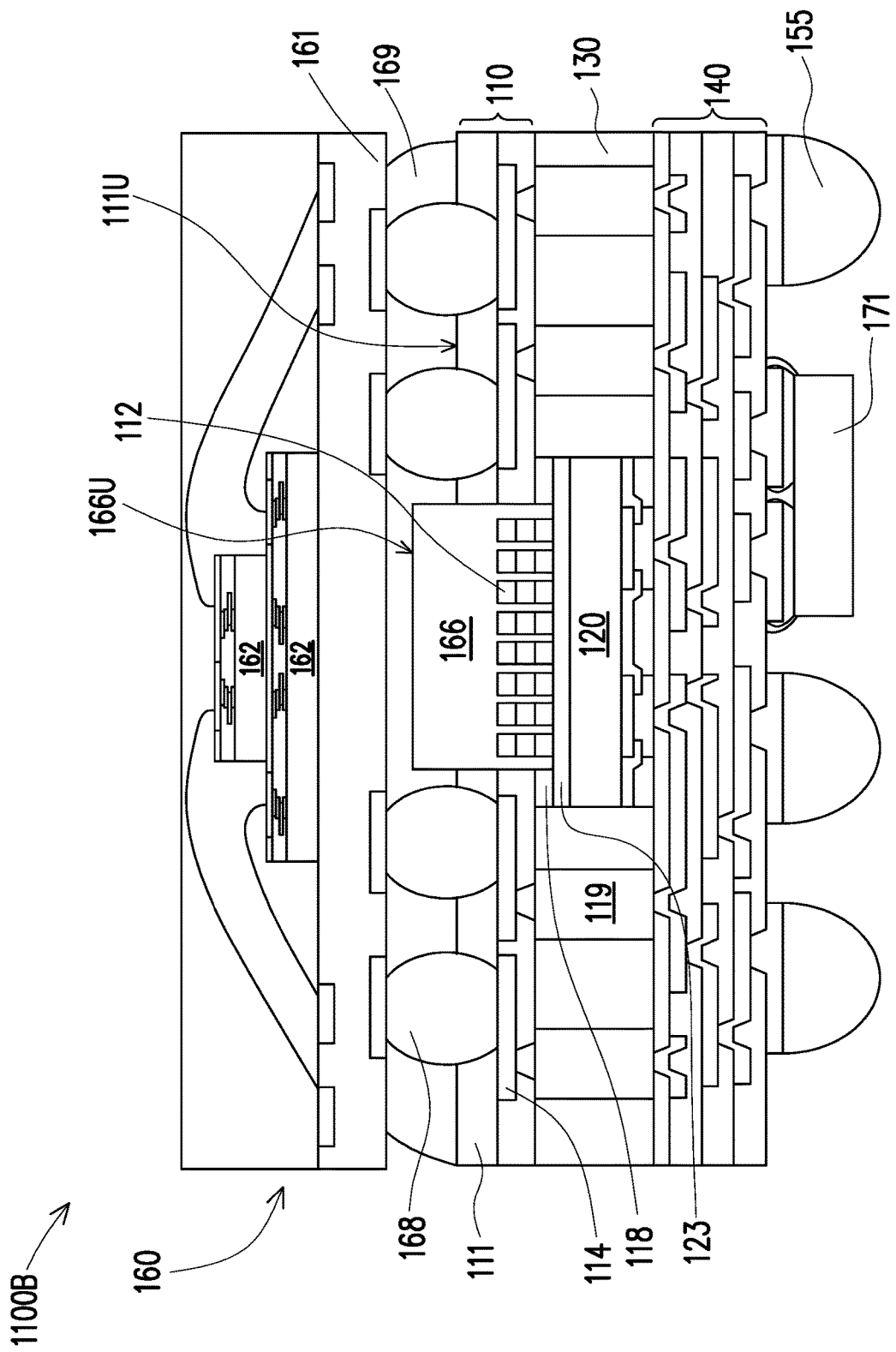
Figure 22:
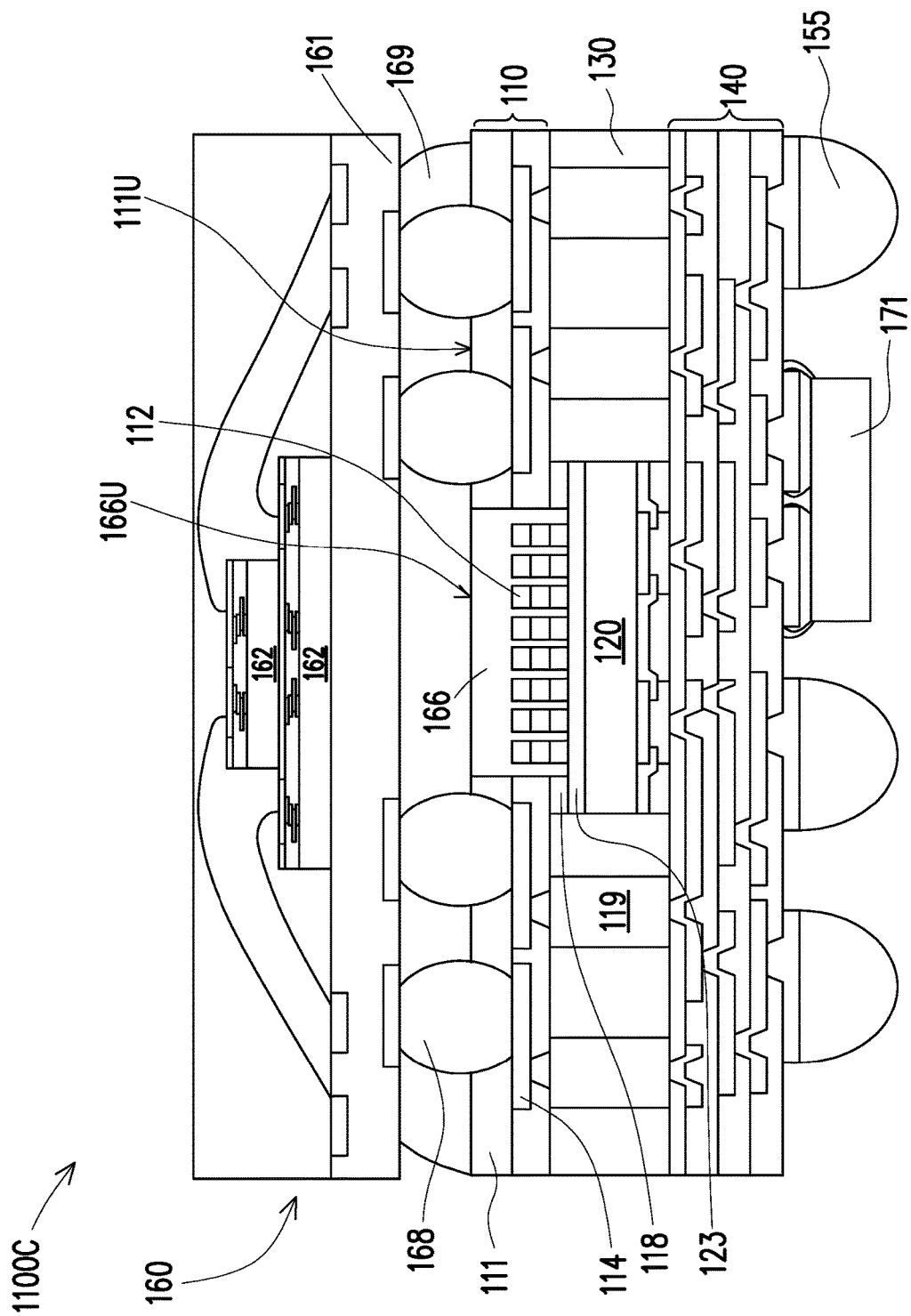
Figure 23:
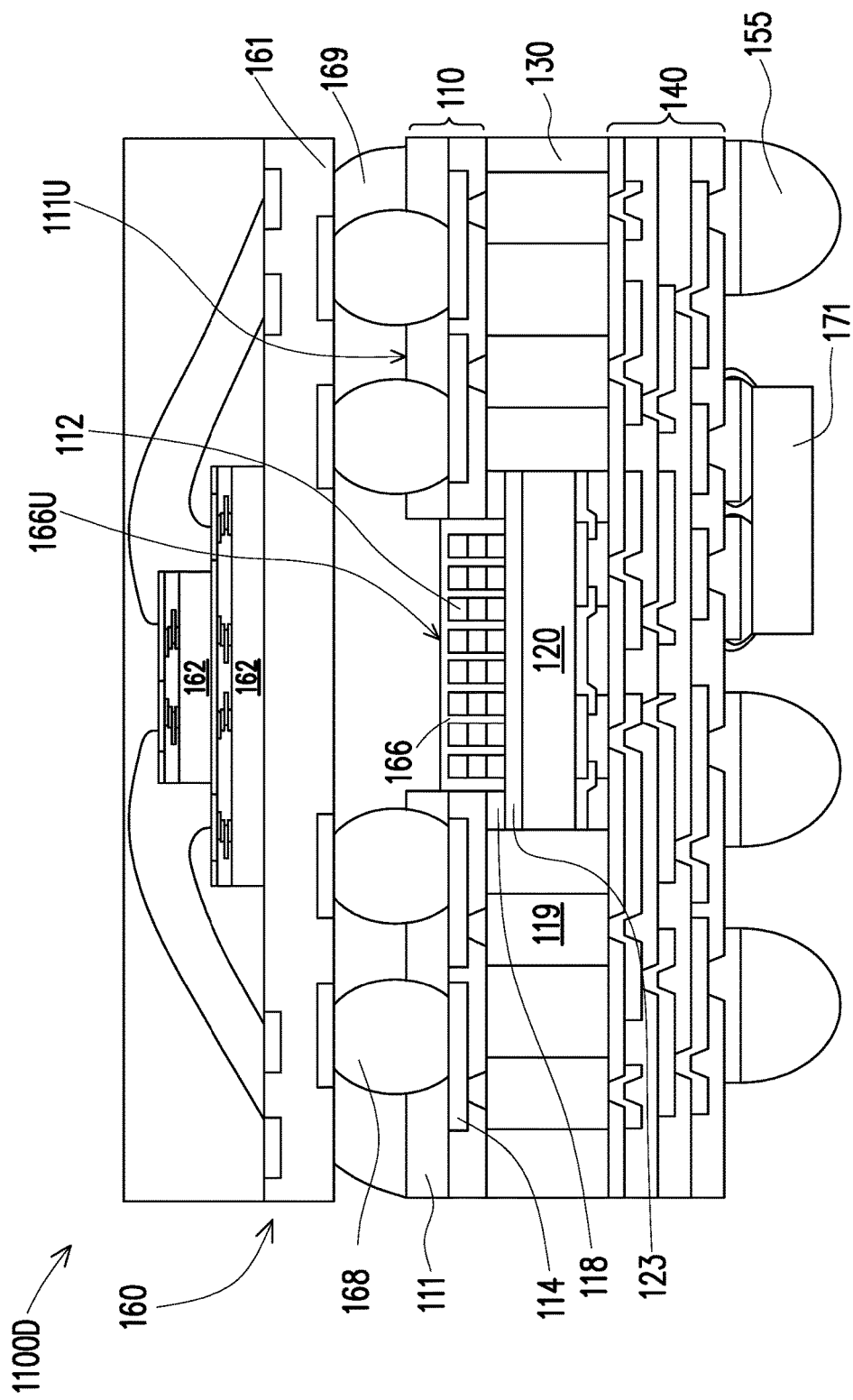

FIGS. 21-23 illustrate cross-sectional view of semiconductor packages 1100B, 1100C and 1100D, respectively, that are similar to the semiconductor package 1100A of FIG. 20, but with the amount (e.g., volume) of the metal paste 166 adjusted (e.g., decreased), such that the upper surface 166U of the cured metal paste 166 is below, therefore does not contact, the substrate 161 of the semiconductor package 160. In particular, in FIG. 21, the upper surface 166U of the cured metal paste 166 is between the substrate 161 and the upper surface 111U of the top dielectric layer (e.g., 111) of the redistribution structure 110. In FIG. 22, the upper surface 166U of the cured metal paste 166 is level with the upper surface 111U of the top dielectric layer (e.g., 111) of the redistribution structure 110. In FIG. 23, the upper surface 166U of the cured metal paste 166 is closer to the die 120 than the upper surface 111U of the top dielectric layer (e.g., 111) of the redistribution structure 110. As illustrated in FIG. 23, a portion of the underfill material 169 directly over the die 120 is closer to the die 120 than portions of the underfill material 169 not directly over the die 120 (e.g., portions contacting the conductive joints 168).

The various embodiments illustrated above are for illustration purpose and not limiting. Additional variations of the disclosed embodiments are possible and are fully intended to be included within the scope of the present disclosure.

Embodiments may achieve advantages. By replacing portions of the dielectric material(s) of the redistribution structure 110 and portions of the adhesive film 118, which have low thermal conductivities, with metal paste that has higher thermal conductivity, the efficiency of heat dissipation of the formed semiconductor package is improved. The improved efficiency of heat dissipation improves the reliability and lifetime of the semiconductor package and reduces failure caused by overheating. The improved efficiency of heat dissipation also allows for higher performance and/or higher integration density, because the semiconductor dies may be operated at higher clock frequencies (higher performance) that generate more heat. In addition, more transistors may be integrated into the dies of the semiconductor package, thereby allowing for higher integration density and reduced manufacturing cost, which may not be possible previously without the presently disclosed structure due to heat dissipation constraints.

Figure 24:
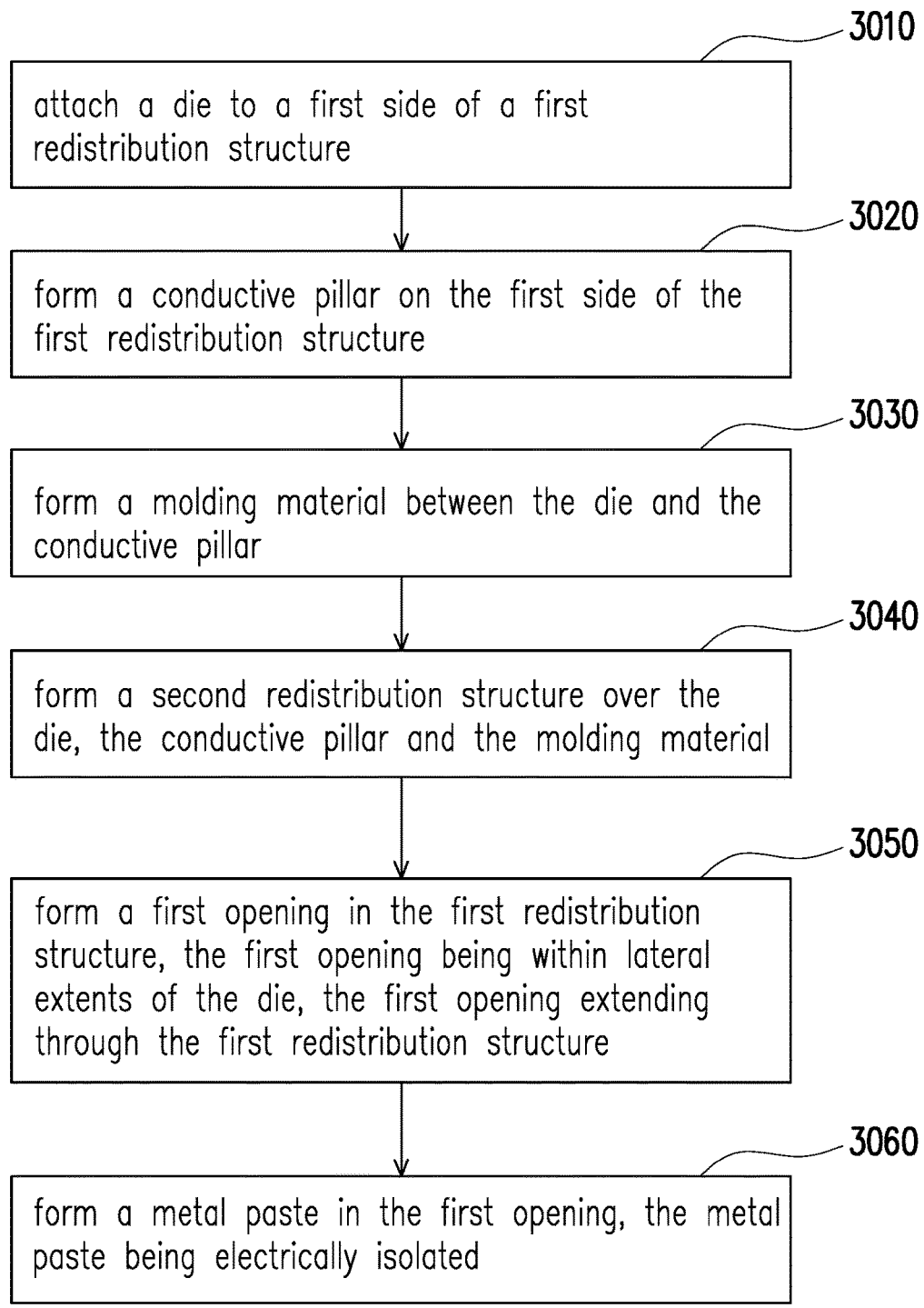
FIG. 24 illustrates a flow char of a method for forming a semiconductor package, in accordance with some embodiments.

FIG. 24 illustrates a flow chart of a method 3000 of fabricating a semiconductor device, in accordance with some embodiments. It should be understood that the embodiment method shown in FIG. 24 is merely an example of many possible embodiment methods. One of ordinary skill in the art would recognize many variations, alternatives, and modifications. For example, various steps as illustrated in FIG. 24 may be added, removed, replaced, rearranged and repeated.

Referring to FIG. 24, at step 3010, a die is attached to a first side of a first redistribution structure. At step 3020, a conductive pillar is formed on the first side of the first redistribution structure. At step 3030, a molding material is formed between the die and the conductive pillar. At step 3040, a second redistribution structure is formed over the die, the conductive pillar and the molding material. At step 3050, a first opening is formed in the first redistribution structure, the first opening being within lateral extents of the die, the first opening extending through the first redistribution structure. At step 3060, a metal paste is formed in the first opening, the metal paste being electrically isolated.

In an embodiment, a semiconductor structure includes a die embedded in a molding material, the die having die connectors on a first side; a first redistribution structure at the first side of the die, the first redistribution structure being electrically coupled to the die through the die connectors; a second redistribution structure at a second side of the die opposing the first side; and a thermally conductive material in the second redistribution structure, the die being interposed between the thermally conductive material and the first redistribution structure, the thermally conductive material extending through the second redistribution structure, and the thermally conductive material being electrically isolated. In an embodiment, the thermally conductive material comprises an adhesive material with metal particles dispersed therein. In an embodiment, the semiconductor structure further includes a metal pillar extending through the molding material, the metal pillar electrically coupling the first redistribution structure to the second redistribution structure. In an embodiment, the thermally conductive material physically contacts the second side of the die. In an embodiment, the second redistribution structure further comprises dummy metal patterns, where the dummy metal patterns contact the thermally conductive material. In an embodiment, the semiconductor structure further includes a dielectric film between the second redistribution structure and the die, the dielectric film being conterminous with the die, where the thermally conductive material extends through the dielectric film. In an embodiment, the semiconductor structure further includes a dummy metal layer disposed on the second side of the die, the dummy metal layer being electrically isolated. In an embodiment, the thermally conductive material physically contacts the dummy metal layer. In an embodiment, the second redistribution structure further includes dummy metal patterns, where the thermally conductive material is disposed between individual ones of the dummy metal patterns. In an embodiment, the semiconductor structure further includes a dielectric film between the second redistribution structure and the dummy metal layer, the dielectric film having a same width with the dummy metal layer, where the thermally conductive material extends through the dielectric film. In an embodiment, a surface of the thermally conductive material distal the die is level with a surface of the second redistribution structure distal the die. In an embodiment, a surface of the thermally conductive material distal the die is closer to the die than a surface of the second redistribution structure distal the die. In an embodiment, a surface of the thermally conductive material distal the die is further from the die than a surface of the second redistribution structure distal the die.

In an embodiment, a semiconductor structure includes a first redistribution structure; a second redistribution structure; a die interposed between the first redistribution structure and the second redistribution structure, where a front side of the die faces the first redistribution structure; a molding material around the die and interposed between the first redistribution structure the second redistribution structure; a heat dissipation structure at least partially embedded in the second redistribution structure, where the heat dissipation structure is electrically isolated and extends from a first side of the second redistribution structure to an opposing second side of the second redistribution structure, and where the die is between the heat dissipation structure and the first redistribution structure; and a semiconductor package electrically coupled to the second redistribution structure. In an embodiment, the heat dissipation structure includes dummy metal patterns of the second redistribution structure; and a metal paste at least partially embedded in the second redistribution structure, the metal paste contacting the dummy metal patterns. In an embodiment, the semiconductor structure further includes a dielectric film between the second redistribution structure and the die, where the dielectric film has a same width as the die, and where the heat dissipation structure extends from a first side of the dielectric film to an opposing second side of the dielectric film. In an embodiment, a first surface of the heat dissipation structure facing the die is closer to the die than a first side of the second redistribution structure facing the die.

In an embodiment, a method includes attaching a die to a first side of a first redistribution structure; forming a conductive pillar on the first side of the first redistribution structure; forming a molding material between the die and the conductive pillar; forming a second redistribution structure over the die, the conductive pillar and the molding material; forming a first opening in the first redistribution structure, the first opening being within lateral extents of the die, the first opening extending through the first redistribution structure; and forming a metal paste in the first opening, the metal paste being electrically isolated. In an embodiment, the method further includes forming a second opening in the first redistribution structure to expose conductive features of the first redistribution structure; attaching connectors of a semiconductor package to the exposed conductive features of the first redistribution structure; and performing a reflow process, the reflow process curing the metal paste and bonding the connectors of the semiconductor package with the exposed conductive features of the first redistribution structure. In an embodiment, the method further includes, before attaching the die, forming a dummy metal layer on a backside of the die, the dummy metal layer being electrically isolated.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure comprising:
a die embedded in a molding material, the die having die connectors on a first side;
a dummy metal layer contacting and extending along a second side of the die opposing the first side, the dummy metal layer having a same width as the die such that sidewalls of the dummy metal layer are aligned with respective sidewalls of the die;
a first redistribution structure at the first side of the die, the first redistribution structure being electrically coupled to the die through the die connectors;
a second redistribution structure at the second side of the die; and
a thermally conductive material in the second redistribution structure, the die being interposed between the thermally conductive material and the first redistribution structure, the thermally conductive material extending through the second redistribution structure, and the thermally conductive material being electrically isolated.

2. The semiconductor structure of claim 1, wherein the thermally conductive material comprises an adhesive material with metal particles dispersed therein.

3. The semiconductor structure of claim 1, further comprising a metal pillar extending through the molding material, the metal pillar electrically coupling the first redistribution structure to the second redistribution structure.

4. The semiconductor structure of claim 1, wherein the second redistribution structure further comprises dummy metal patterns, wherein the dummy metal patterns contact the thermally conductive material.

5. The semiconductor structure of claim 4, further comprising a dielectric film between the second redistribution structure and the die, sidewalls of the dielectric film being aligned with respective sidewalls of the die, wherein the thermally conductive material extends from a first side of the dielectric film to an opposing second side of the dielectric film.

6. The semiconductor structure of claim 1, wherein the thermally conductive material physically contacts the dummy metal layer.

7. The semiconductor structure of claim 6, wherein the second redistribution structure further comprises dummy metal patterns, wherein the thermally conductive material is disposed between individual ones of the dummy metal patterns.

8. The semiconductor structure of claim 7, further comprising a dielectric film between the second redistribution structure and the dummy metal layer, the dielectric film having a same width with the dummy metal layer, wherein the thermally conductive material extends through the dielectric film.

9. The semiconductor structure of claim 1, wherein a surface of the thermally conductive material distal the die is level with a surface of the second redistribution structure distal the die.

10. The semiconductor structure of claim 1, wherein a surface of the thermally conductive material distal the die is closer to the die than a surface of the second redistribution structure distal the die.

11. The semiconductor structure of claim 1, wherein a surface of the thermally conductive material distal the die is further from the die than a surface of the second redistribution structure distal the die.

12. A semiconductor structure comprising:
a first redistribution structure;
a second redistribution structure;
a die interposed between the first redistribution structure and the second redistribution structure, wherein a front side of the die faces the first redistribution structure;

a molding material around the die and interposed between the first redistribution structure the second redistribution structure;

a heat dissipation structure at least partially embedded in the second redistribution structure, wherein the heat dissipation structure is electrically isolated and extends from a first side of the second redistribution structure to an opposing second side of the second redistribution structure, and wherein the die is between the heat dissipation structure and the first redistribution structure;

a dielectric film between the second redistribution structure and the die, wherein the dielectric film has a same width as the die, and wherein the heat dissipation structure extends from a first side of the dielectric film to an opposing second side of the dielectric film; and a semiconductor package electrically coupled to the second redistribution structure.

13. The semiconductor structure of claim 12, wherein the heat dissipation structure comprises:

dummy metal patterns of the second redistribution structure; and a metal paste at least partially embedded in the second redistribution structure, the metal paste contacting the dummy metal patterns.

14. The semiconductor structure of claim 12, wherein a first surface of the heat dissipation structure facing the die is closer to the die than a first side of the second redistribution structure facing the die.

15. A semiconductor structure comprising:

a die attached to a first side of a first redistribution structure;

a conductive pillar on the first side of the first redistribution structure;

a molding material around the die and the conductive pillar;

a second redistribution structure over the die, the conductive pillar and the molding material;

a metal paste embedded in the second redistribution structure and disposed within lateral extents of the die, the metal paste extending through the second redistribution structure, and the metal paste being electrically isolated; and a dummy metal layer between the die and the metal paste, wherein the dummy metal layer and the die have a same width.

16. The semiconductor structure of claim 15, further comprising a semiconductor package bonded to conductive features of the second redistribution structure, wherein an upper surface of the metal paste facing the semiconductor package is closer to the semiconductor package than an upper surface of the second redistribution structure facing the semiconductor package.

17. The semiconductor structure of claim 1, wherein the second redistribution structure has dummy metal patterns and dielectric layers, the dummy metal patterns being separated from the dummy metal layer by at least one of the dielectric layers of the second redistribution structure.

18. The semiconductor structure of claim 1, wherein thermally conductive material is a metal paste.

19. The semiconductor structure of claim 18, wherein the thermally conductive material and the dummy metal layer have different compositions.

20. The semiconductor structure of claim 1, wherein the molding material has a first surface facing with the second redistribution structure, wherein the semiconductor structure further comprises a dielectric film between the second redistribution structure and the dummy metal layer, the dielectric film having a same width with the die, and a first surface of the dielectric film facing the die being closer to the die than the first surface of the molding material, wherein the thermally conductive material extends through the dielectric film.

* * * * *